(12) United States Patent  
Takahashi

(10) Patent No.: US 9,136,401 B2
(45) Date of Patent: Sep. 15, 2015

(54) COMPOUND SEMICONDUCTOR DEVICE AND METHOD OF MANUFACTURING THE SAME

(71) Applicant: FUJITSU LIMITED, Kawasaki-shi, Kanagawa (JP)

(72) Inventor: Tsuyoshi Takahashi, Ebina (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/311,697

(22) Filed: Jun. 23, 2014

(65) Prior Publication Data
US 2015/0028391 A1    Jan. 29, 2015

(30) Foreign Application Priority Data

Jul. 25, 2013    (JP) .................................. 2013-154778

(51) Int. Cl.
*H01L 29/66* (2006.01)
*H01L 29/88* (2006.01)
*H01L 29/205* (2006.01)
*H01L 21/306* (2006.01)
*H01L 29/778* (2006.01)
*H01L 29/06* (2006.01)

(52) U.S. Cl.
CPC .......... *H01L 29/88* (2013.01); *H01L 21/30612* (2013.01); *H01L 29/0657* (2013.01); *H01L 29/205* (2013.01); *H01L 29/66219* (2013.01); *H01L 29/66462* (2013.01); *H01L 29/7783* (2013.01)

(58) Field of Classification Search
CPC ...................... H01L 29/7786; H01L 29/66431; H01L 21/30612; H01L 29/205; H01L 29/88

USPC ........................................................ 257/195
See application file for complete search history.

(56) References Cited

U.S. PATENT DOCUMENTS

| | | | |
|---|---|---|---|
| 5,477,169 A | 12/1995 | Jun et al. | |
| 2005/0230706 A1 | 10/2005 | Yagyu et al. | |
| 2010/0248676 A1 | 9/2010 | Takahashi | |
| 2012/0043587 A1 | 2/2012 | Takahashi | |
| 2012/0299057 A1 | 11/2012 | Takahashi | |

FOREIGN PATENT DOCUMENTS

| | | |
|---|---|---|
| JP | 1996-008418 | 1/1996 |
| JP | 2005-328036 | 11/2005 |
| JP | 2010-251689 | 11/2010 |
| JP | 2012-043965 | 3/2012 |

*Primary Examiner* — Elias M Ullah
(74) *Attorney, Agent, or Firm* — Fujitsu Patent Center

(57) ABSTRACT

A compound semiconductor device includes a substrate, a p-type first semiconductor layer over the substrate and contains antimony, a p-type second semiconductor layer over the first semiconductor layer and contains antimony, an n-type third semiconductor layer over the second semiconductor layer, a fourth semiconductor layer between the first semiconductor layer and the second semiconductor layer, the fourth semiconductor layer containing phosphorus and having a thickness in which electrons tunnel between the first semiconductor layer and the second semiconductor layer, a first electrode in ohmic contact with the first semiconductor layer, and a second electrode in ohmic contact with the third semiconductor layer. The first semiconductor layer is made from a material whose contact resistance with the first electrode is lower than contact resistance of the second semiconductor layer.

17 Claims, 22 Drawing Sheets

COMPOUND SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2013-154778, filed on Jul. 25, 2013, the entire contents of which are incorporated herein by reference.

FIELD

The embodiments discussed herein are directed to a compound semiconductor device and a method of manufacturing the same.

BACKGROUND

A low-noise amplifier (LNA) and a wave detector are included in a monolithic microwave integrated circuit (MMIC), which is used for detecting a weak high-frequency signal in a millimeter wave region. A backward diode is sometimes used as the wave detector. A backward diode is possible to sharpen rising of current compared to a Schottky diode.

However, there is a problem in which it is difficult to obtain a mesa structure stably in a conventional backward diode. Namely, it is difficult to obtain sufficient reproducibility and reliability. The problem as stated above may occur in a pn junction diode.

[Patent Document 1] Japanese Laid-open Patent Publication No. 2010-251689
[Patent Document 2] Japanese Laid-open Patent Publication No. 2005-328036
[Patent Document 3] Japanese Laid-open Patent Publication No. 08-8418
[Patent Document 4] Japanese Laid-open Patent Publication No. 2012-43965

SUMMARY

According to an aspect of the embodiments, a compound semiconductor device includes: a substrate; a p-type first semiconductor layer over the substrate and contains antimony; a p-type second semiconductor layer over the first semiconductor layer and contains antimony; an n-type third semiconductor layer over the second semiconductor layer; a fourth semiconductor layer between the first semiconductor layer and the second semiconductor layer, the fourth semiconductor layer containing phosphorus and having a thickness in which electrons tunnel between the first semiconductor layer and the second semiconductor layer; a first electrode in ohmic contact with the first semiconductor layer; and a second electrode in ohmic contact with the third semiconductor layer. The first semiconductor layer is made from a material whose contact resistance with the first electrode is lower than contact resistance of the second semiconductor layer.

According to another aspect of the embodiments, a method of manufacturing a compound semiconductor device includes: forming a p-type first semiconductor layer containing antimony over a substrate; forming a fourth semiconductor layer containing phosphorus over the first semiconductor layer; forming a p-type second semiconductor layer containing antimony over the fourth semiconductor layer; forming an n-type third semiconductor layer over the second semiconductor layer; etching the third semiconductor layer and the second semiconductor layer until the fourth semiconductor layer is exposed; etching the fourth semiconductor layer until the first semiconductor layer is exposed; forming a first electrode in ohmic contact with the first semiconductor layer; and forming a second electrode in ohmic contact with the third semiconductor layer. The first semiconductor layer is made from a material whose contact resistance with the first electrode is lower than that of the second semiconductor layer. The fourth semiconductor layer has a thickness in which electrons tunnel between the first semiconductor layer and the second semiconductor layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

The present inventor studied as for reasons why it is difficult to obtain a mesa structure stably when a conventional backward diode is manufactured. As a result, the following matters become obvious. Firstly, it is difficult to control a lateral etching of a p-type semiconductor layer, especially a p-type GaAsSb layer. Secondary, a function as a part of a diode and a function to secure ohmic contact are required for the p-type semiconductor layer. Thirdly, the p-type semiconductor layer is formed to be thick to enable the above-stated functions. Namely, a p-type semiconductor layer such as a p-type GaAsSb layer, whose lateral etching control is difficult, is formed to be thick, and therefore, an unstable lateral etching largely occurs during a mesa etching of the p-type semiconductor layer.

Figure 1A:
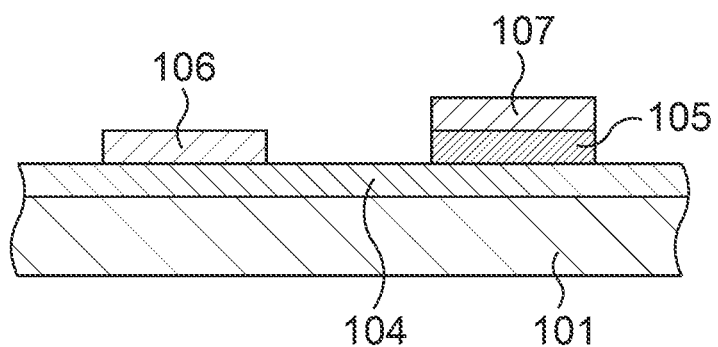
FIG. 1A is a sectional view illustrating a first reference example.

The inventor studied about a configuration in which mesa etching of a p-type semiconductor layer is unnecessary. For example, the inventor studied about forming a p-type semiconductor layer on a substrate, and forming an n-type semiconductor layer thereon. This configuration is illustrated in FIG. 1A. In a first reference example illustrated in FIG. 1A, a p-type semiconductor layer 104 such as a p-type GaAsSb layer is formed on a substrate 101, an n-type semiconductor layer 105 such as an n-type InGaAs layer is formed on a part of the p-type semiconductor layer 104, and an ohmic electrode 107 is formed on the n-type semiconductor layer 105. An ohmic electrode 106 is formed on another part of the p-type semiconductor layer 104.

Impurities are largely doped into the n-type semiconductor layer 105 and the p-type semiconductor layer 104, and a Fermi-level is in a conduction band or in a valence band, or is in the close vicinity of a lower end of the conduction band or an upper end of the valence band in a forbidden band. Accordingly, the n-type semiconductor layer 105 and the p-type semiconductor layer 104 constitute a backward diode, the ohmic electrode 106 functions as an anode electrode, and the ohmic electrode 107 functions as a cathode electrode.

Control of mesa etching of the n-type semiconductor layer 105 is easier than control of etching of the p-type semiconductor layer 104, and therefore, according to the first reference example, it is easy to obtain a mesa structure stably compared to a conventional structure. However, in the first reference example, there are problems in which an etching selectivity between the n-type semiconductor layer 105 and the p-type semiconductor layer 104 is small and a contact resistance of the ohmic electrode 106 with the p-type semiconductor layer 104 is high.

Figure 1B:
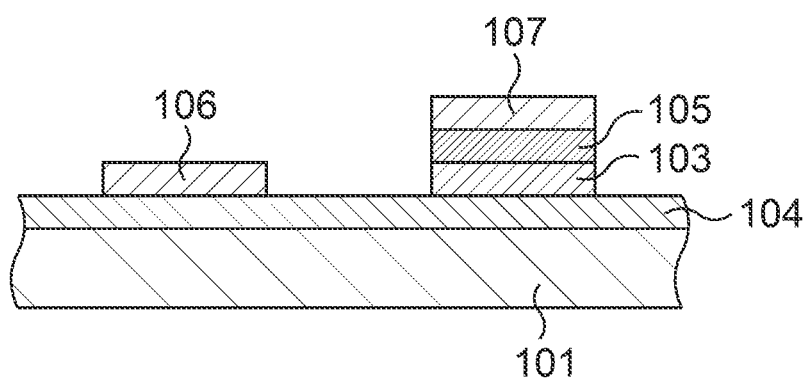
FIG. 1B is a sectional view illustrating a second reference example.

To solve the problem relating to the etching selectivity, it is conceivable to provide an etching stopper layer 103 between the n-type semiconductor layer 105 and the p-type semiconductor layer 104 as a second reference example illustrated in FIG. 1B. However, it is impossible even by the second reference example to solve the problem in which the contact resistance is high.

To solve the problem relating to the contact resistance, it is also conceivable to provide an n-type semiconductor layer to which a lot of impurities are doped between the ohmic electrode 106 and the p-type semiconductor layer 104, but a process to form the layer is complicated.

The present inventor has figured out following embodiments as a result of further hard studies in consideration of these matters.

First Embodiment

Figure 2A:
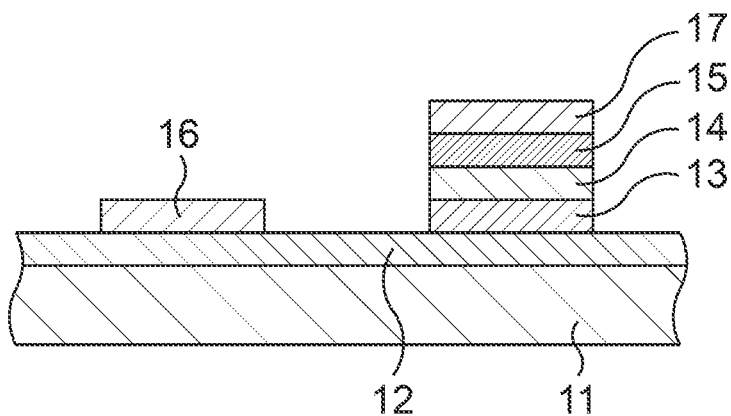
FIG. 2A is a sectional view illustrating a structure of a compound semiconductor device according to a first embodiment.
Figure 2B:
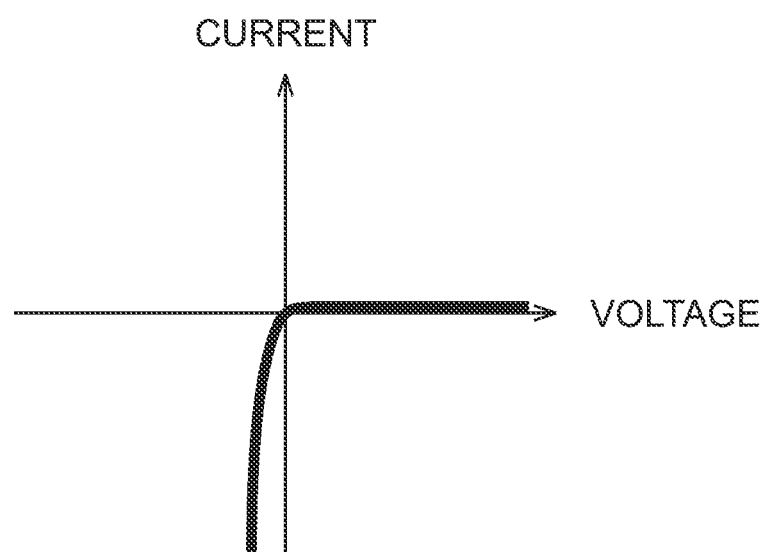
FIG. 2B is a view illustrating characteristics of the compound semiconductor device according to the first embodiment.

First, a first embodiment is described. FIGS. 2A and 2B are views illustrating a compound semiconductor device (backward diode) according to the first embodiment. FIG. 2A is a sectional view illustrating a structure of the compound semiconductor device, and FIG. 2B is a view illustrating characteristics of the compound semiconductor device. FIGS. 3A to 3D are views illustrating an energy band of the compound semiconductor device (backward diode) according to the first embodiment.

In the first embodiment, as illustrated in FIG. 2A, a p-type semiconductor layer 12 is formed on a substrate 11, and an etching stopper layer 13 is formed on a part of the p-type semiconductor layer 12. A p-type semiconductor layer 14 is formed on the etching stopper layer 13, an n-type semiconductor layer 15 is formed on the p-type semiconductor layer 14, and an ohmic electrode 17 is formed on the n-type semiconductor layer 15. An ohmic electrode 16 is formed on another part of the p-type semiconductor layer 12. A mesa structure is formed at least at the n-type semiconductor layer 15 and the p-type semiconductor layer 14.

Impurities are largely doped into the n-type semiconductor layer 15 and the p-type semiconductor layer 14. The p-type semiconductor layer 12 is made from a material whose contact resistance with the ohmic electrode 16 is lower than contact resistance of the p-type semiconductor layer 14. In other words, though the p-type semiconductor layer 14 is not in contact with the ohmic electrode 16 in the embodiment, the contact resistance of the p-type semiconductor layer 14 with the ohmic electrode 16 would be higher than the contact resistance of the p-type semiconductor layer 12 if the p-type semiconductor layer 14 were in contact with the ohmic electrode 16. The p-type semiconductor layer 12 and the p-type semiconductor layer 14 contain antimony (Sb), and the etching stopper layer 13 contains phosphorus (P). A thickness of the etching stopper layer 13 is in a range in which electrons tunnel between the p-type semiconductor layer 12 and the p-type semiconductor layer 14. The p-type semiconductor layer 12 is an example of a first semiconductor layer, the p-type semiconductor layer 14 is an example of a second semiconductor layer, the n-type semiconductor layer 15 is an example of a third semiconductor layer, and the etching stopper layer 13 is an example of a fourth semiconductor layer.

The ohmic electrode 16 is an example of a first electrode, and the ohmic electrode 17 is an example of a second electrode.

Figure 3A:
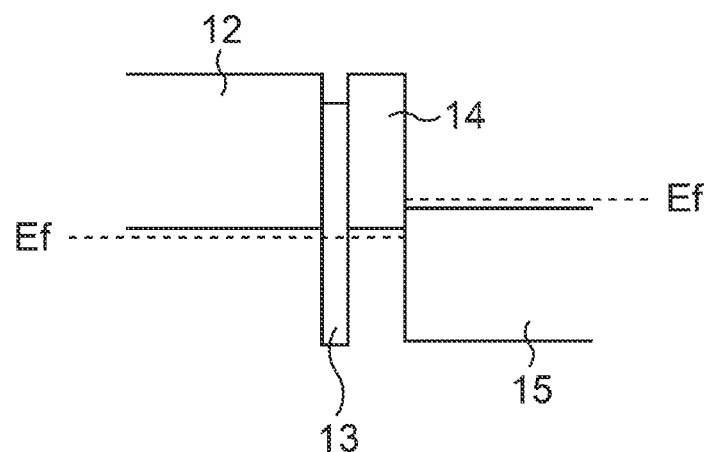
FIG. 3A is a view illustrating an energy band of the first embodiment in a flat band state.

FIG. 3A is a view illustrating an energy band in a flat band state of the first embodiment. When a flat band voltage is applied between the n-type semiconductor layer 15 and the p-type semiconductor layers 12 and 14, bend of energy band is eliminated, and the energy band is flat. In this state, a Fermi-level Ef is in the conduction band in the n-type semiconductor layer 15, and a Fermi-level Ef is in the valence band in the p-type semiconductor layers 12 and 14. Namely, each of the n-type semiconductor layer 15, the p-type semiconductor layer 14, and the p-type semiconductor layer 12 is degenerated.

Figure 3B:
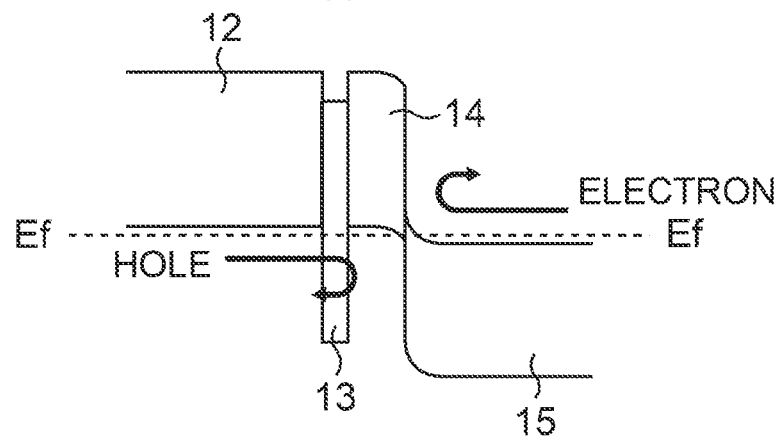
FIG. 3B is a view illustrating an energy band of the first embodiment in an equilibrium state.

FIG. 3B is a view illustrating an energy band of the first embodiment in an equilibrium state. In the equilibrium state, the energy level of the valence band is slightly higher than the Fermi-level Ef in the p-type semiconductor layers 12 and 14, and the energy level of the conduction band is slightly lower than the Fermi-level Ef in the n-type semiconductor layer 15. Accordingly, current does not flow in the equilibrium state.

Figure 3C:
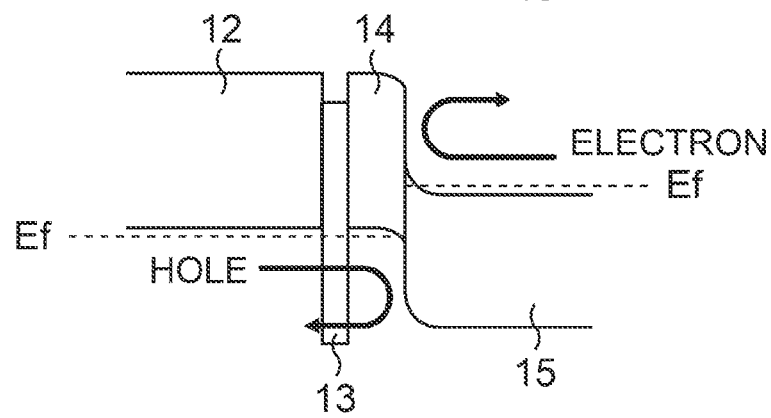
FIG. 3C is a view illustrating an energy band of the first embodiment in a state in which a forward bias is applied.

FIG. 3C is a view illustrating an energy band of the first embodiment in a state in which a forward bias is applied. When a forward bias is applied, the energy level of the p-type semiconductor layers 12 and 14 is lowered. However, the current does not flow until the forward bias reaches a certain threshold because electrons and holes cannot move between the p-type semiconductor layers 12 and 14 and the n-type semiconductor layer 15.

Figure 3D:
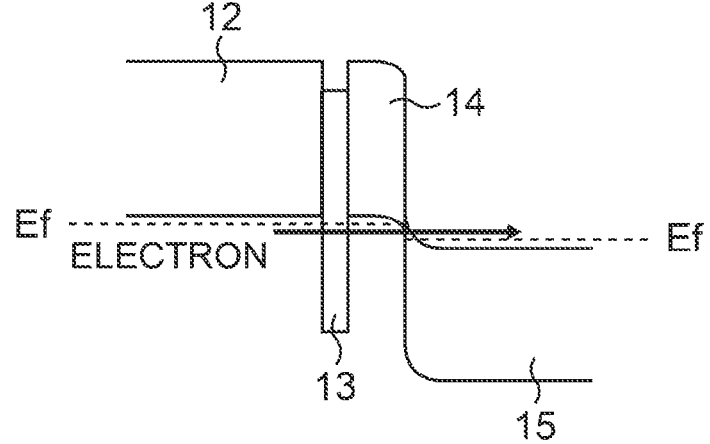
FIG. 3D is a view illustrating an energy band of the first embodiment in a state in which a backward bias is applied.

FIG. 3D is a view illustrating an energy band of the first embodiment in a state in which a backward bias is applied. When a backward bias is applied, electrons tunnel from the valence band in the p-type semiconductor layers 12 and 14 to the conduction band in the n-type semiconductor layer 15 by tunnel effect, and current flows.

Therefore, according to the first embodiment, voltage-current characteristics illustrated in FIG. 2B may be obtained. Namely, the n-type semiconductor layer 15 and the p-type semiconductor layer 14 are included in a backward diode. The ohmic electrode 16 functions as an anode electrode, and the ohmic electrode 17 functions as a cathode electrode. Besides, the p-type semiconductor layer 12 is made from a material whose contact resistance with the ohmic electrode 16 is lower than contact resistance of the p-type semiconductor layer 14, and the p-type semiconductor layer 12 takes a function to secure ohmic contact. Accordingly, a thickness as same as a conventional art and the reference example is not required for the p-type semiconductor layer 14. Therefore, even if mesa etching of the p-type semiconductor layer 14 is unstable, an effect thereof is extremely small.

Second Embodiment

Figure 4A:
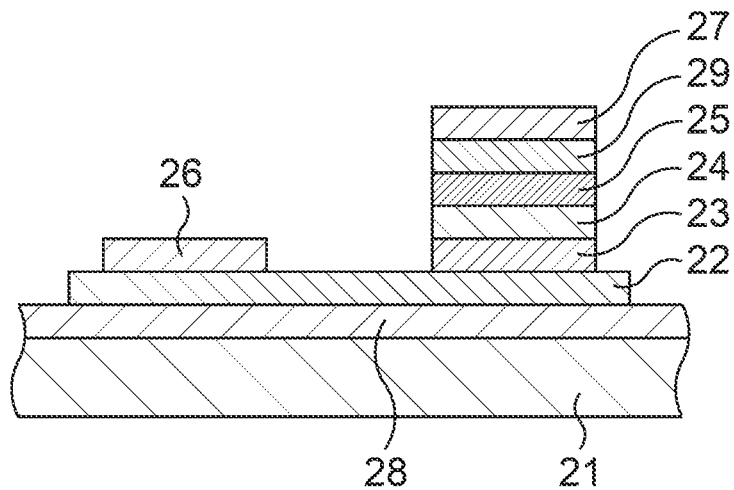
FIG. 4A is a sectional view illustrating a structure of a compound semiconductor device according to a second embodiment.
Figure 4B:
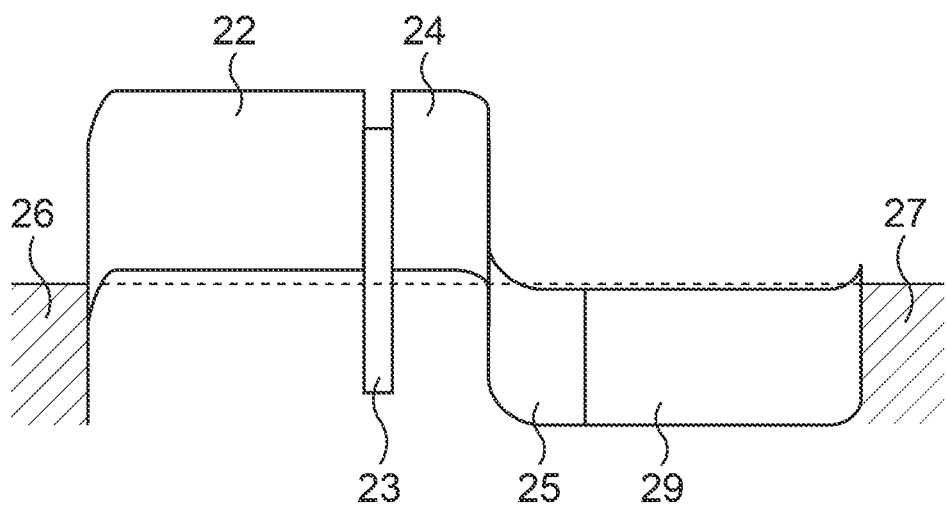
FIG. 4B is a view illustrating an energy band of the second embodiment in an equilibrium state.

Next, a second embodiment is described. FIGS. 4A and 4B are views illustrating a compound semiconductor device (backward diode) according to the second embodiment. FIG. 4A is a sectional view illustrating a structure of the compound semiconductor device, and FIG. 4B is a view illustrating an energy band in an equilibrium state.

In the second embodiment, as illustrated in FIG. 4A, a buffer layer 28 is formed on a substrate 21, and a p-type semiconductor layer 22 is formed on the buffer layer 28. An etching stopper layer 23 is formed on a part of the p-type semiconductor layer 22, and a p-type semiconductor layer 24 is formed on the etching stopper layer 23. An n-type semiconductor layer 25 is formed on the p-type semiconductor layer 24, an n-type semiconductor layer 29 is formed on the n-type semiconductor layer 25, and an ohmic electrode 27 is formed on the n-type semiconductor layer 29. An ohmic electrode 26 is formed on another part of the p-type semiconductor layer 22. A mesa structure is formed at least at the n-type semiconductor layer 25 and the p-type semiconductor layer 24.

The substrate 21 is, for example, a semi-insulating InP substrate. The buffer layer 28 is, for example, an $In_{0.52}Al_{0.48}As$ layer (i-InAlAs layer), into which intentional impurity doping is not performed. A thickness of the buffer layer 28 is, for example, approximately 300 nm.

The p-type semiconductor layer 22 is, for example, a p-type $GaAs_{0.51}Sb_{0.49}$ layer ($p^+$-GaAsSb layer). A thickness of the p-type semiconductor layer 22 is, for example, approximately 200 nm. For example, zinc (Zn) is doped into the p-type semiconductor layer 22 for approximately $2\times10^{19}$ $cm^{-3}$ as p-type impurity. The etching stopper layer 23 is, for example, an InP layer (i-InP layer), into which intentional impurity doping is not performed. A thickness of the etching stopper layer 23 is in a range in which electrons tunnel between the p-type semiconductor layer 22 and the p-type semiconductor layer 24, for example, approximately 5 nm. The p-type semiconductor layer 24 is, for example, a p-type $GaAs_{0.51}Sb_{0.49}$ layer ($p^+$-GaAsSb layer). A thickness of the p-type semiconductor layer 24 is, for example, approximately 50 nm. For example, zinc (Zn) is doped into the p-type semiconductor layer 24 for approximately $1\times10^{19}$ $cm^{-3}$ as p-type impurity. Each of the p-type semiconductor layer 24 and the p-type semiconductor layer 22 is degenerated.

The n-type semiconductor layer 25 is, for example, an n-type $In_{0.53}Ga_{0.47}As$ layer ($n^+$-InGaAs layer). A thickness of the n-type semiconductor layer 25 is, for example, approximately 50 nm. For example, silicon (Si) is doped into the n-type semiconductor layer 25 for approximately $1\times10^{18}$ $cm^{-3}$ as n-type impurity. The n-type semiconductor layer 29 is, for example, an n-type $In_{0.53}Ga_{0.47}As$ layer ($n^+$-InGaAs layer). A thickness of the n-type semiconductor layer 29 is, for example, approximately 200 nm. For example, silicon (Si) is doped into the n-type semiconductor layer 29 for approximately $2\times10^{19}$ $cm^{-3}$ as n-type impurity. Each of the n-type semiconductor layer 29 and the n-type semiconductor layer 25 is degenerated.

A titanium (Ti) film, a platinum (Pt) film thereon, and a gold (Au) film thereon are included in each of the ohmic electrodes 26 and 27. Thicknesses of the Ti film, the Pt film, and the Au film are, for example, approximately 10 nm, 30 nm, 300 nm, respectively.

The p-type semiconductor layer 22 is an example of the first semiconductor layer, the p-type semiconductor layer 24 is an example of the second semiconductor layer, the n-type semiconductor layer 25 is an example of the third semiconductor layer, and the etching stopper layer 23 is an example of the fourth semiconductor layer. The ohmic electrode 26 is an example of the first electrode, and the ohmic electrode 27 is an example of the second electrode.

In the second embodiment, the n-type semiconductor layer 25 and the p-type semiconductor layer 24 are included in a backward diode. Namely, current does not flow in an equilibrium state, current does not flow until the forward bias reaches a certain threshold even if a forward bias is applied, and current flows owing to tunnel phenomenon when a backward bias is applied.

Besides, impurities are doped into the p-type semiconductor layer 22 more than the p-type semiconductor layer 24, and therefore, change of the valence band of the p-type semiconductor layer 22 at an end of the ohmic electrode 26 side is abrupt as illustrated in FIG. 4B. Accordingly, the tunnel phenomenon is easy to happen, and a contact resistance of the ohmic electrode 26 with the p-type semiconductor layer 22 is low. Further, the p-type semiconductor layer 22 takes a function to secure ohmic contact, and therefore, a thickness as same as a conventional art and the reference example is not required for the p-type semiconductor layer 24. Therefore, even if the mesa etching of the p-type semiconductor layer 24 is unstable, an effect thereof is extremely small.

Next, a method of manufacturing the compound semiconductor device (backward diode) according to the second embodiment is described. FIG. 5A to FIG. 5F are sectional views illustrating the method of manufacturing the compound semiconductor device according to the second embodiment in process sequence.

Figure 5A:
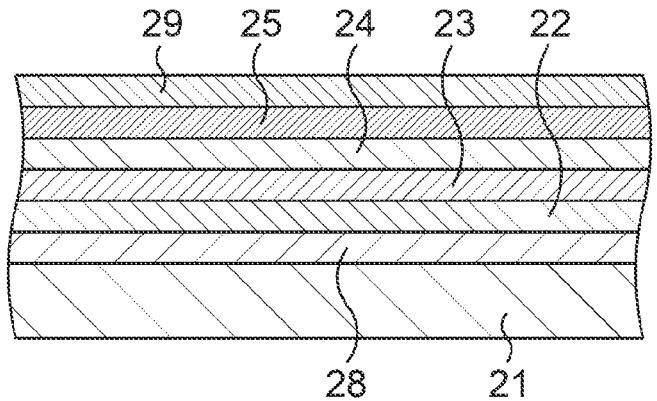
FIG. 5A to FIG. 5F are sectional views illustrating a method of manufacturing the compound semiconductor device according to the second embodiment in process sequence.

First, as illustrated in FIG. 5A, the buffer layer 28, the p-type semiconductor layer 22, the etching stopper layer 23, the p-type semiconductor layer 24, the n-type semiconductor layer 25, and the n-type semiconductor layer 29 are formed on the substrate 21. The buffer layer 28, the p-type semiconductor layer 22, the etching stopper layer 23, the p-type semiconductor layer 24, the n-type semiconductor layer 25, and the n-type semiconductor layer 29 may be formed by, for example, a metal-organic chemical vapor deposition (MOCVD) method.

Figure 5B:
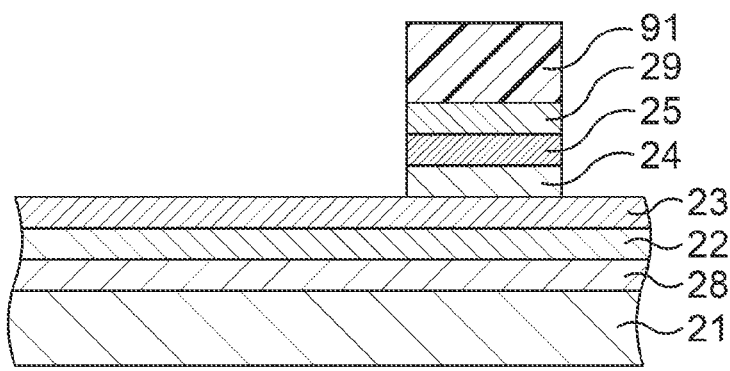

Then, as illustrated in FIG. 5B, a mask 91 covering a region where a backward diode is to be formed is formed on the n-type semiconductor layer 29. The mask 91 may be formed by, for example, a photolithography technology. Thereafter, the n-type semiconductor layer 29, the n-type semiconductor layer 25, and the p-type semiconductor layer 24 are etched while using the mask 91 as an etching mask. In this etching, wet etching using, for example, a mixed solution of phosphoric acid and hydrogen peroxide solution may be performed. This etching stops at the etching stopper layer 23.

Figure 5C:
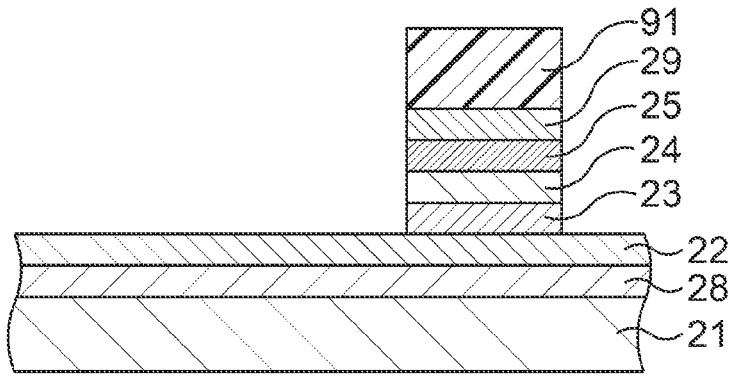

Thereafter, as illustrated in FIG. 5C, the etching stopper layer 23 is etched while using the mask 91 as an etching mask. In this etching, wet etching using, for example, hydrochloric acid may be performed. This etching stops at the p-type semiconductor layer 22.

Figure 5D:
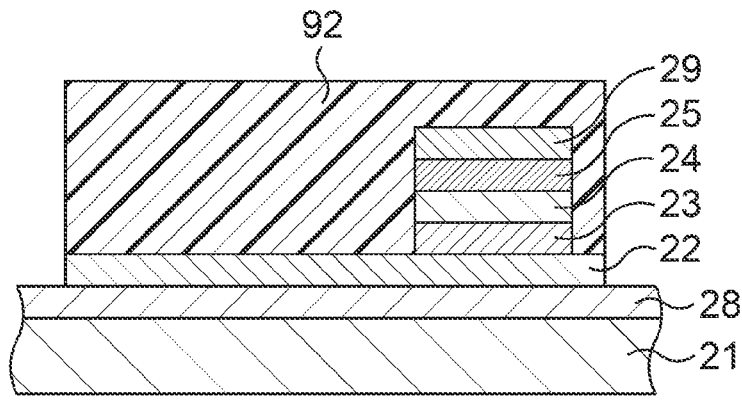

Subsequently, as illustrated in FIG. 5D, the mask 91 is removed, and a mask 92 exposing a region where an element isolation mesa is to be formed is formed on the p-type semiconductor layer 22. The mask 92 is formed so as to cover a stack of the etching stopper layer 23, the p-type semiconductor layer 24, the n-type semiconductor layer 25, and the n-type semiconductor layer 29. The mask 92 may be formed by, for example, a photolithography technology. Then, the p-type semiconductor layer 22 is etched while using the mask 92 as an etching mask. In this etching, wet etching using, for example, a mixed solution of phosphoric acid and hydrogen peroxide solution may be performed. This etching stops at the buffer layer 28. Even if the wet etching of the p-type semiconductor layer 22 is unstable, an effect on characteristics of the backward diode is negligible.

Figure 5E:
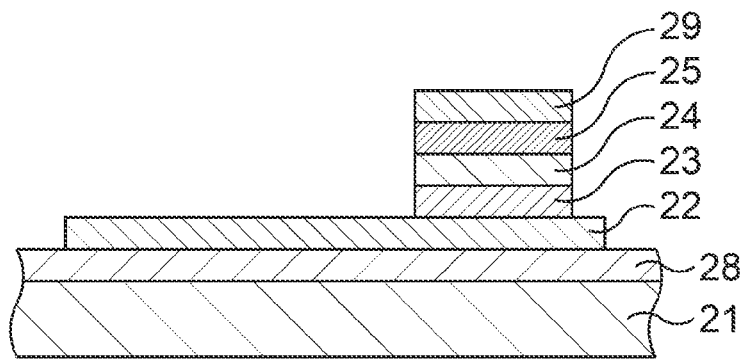
Figure 5F:
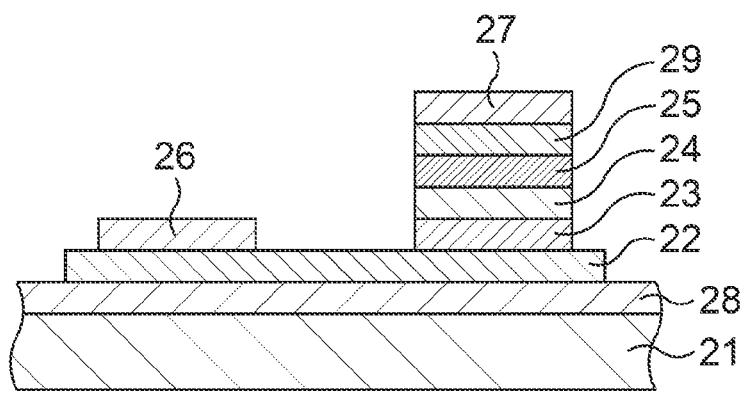

Thereafter, as illustrated in FIG. 5E, the mask 92 is removed. Subsequently, as illustrated in FIG. 5F, the ohmic electrode 26 is formed on a part of the p-type semiconductor layer 22, and the ohmic electrode 27 is formed on the n-type semiconductor layer 29. The ohmic electrodes 26 and 27 may be formed by, for example, a lift-off method. When the ohmic electrodes 26 and 27 are formed by the lift-off method, a mask exposing a region where they are to be formed is formed, and the Ti film, the Pt film, and the Au film are formed by a vapor deposition method, for example, while using the mask as a film-forming mask. The mask is then removed together with the Ti film, the Pt film, and the Au film thereon.

A passivation film and so on are formed as necessary to complete the compound semiconductor device (backward diode).

In this manufacturing method, the p-type semiconductor layer 24 is thin, and therefore, a time required for etching the p-type semiconductor layer 24 is short, and even if the mesa etching of the p-type semiconductor layer 24 is unstable, an effect thereof is extremely small. Besides, even if the wet etching of the p-type semiconductor layer 22, which is relatively thick, is unstable, an effect on the characteristics of the backward diode is negligible. Further, the p-type semiconductor layer 24 is not etched during the wet etching of the p-type semiconductor layer 22. It is because the p-type semiconductor layer 24 is protected by the mask 92.

Third Embodiment

Figure 6A:
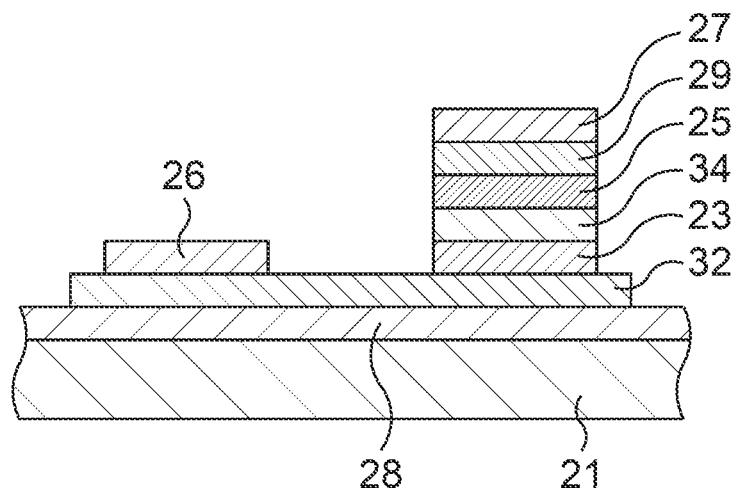
FIG. 6A is a sectional view illustrating a structure of a compound semiconductor device according to a third embodiment.
Figure 6B:
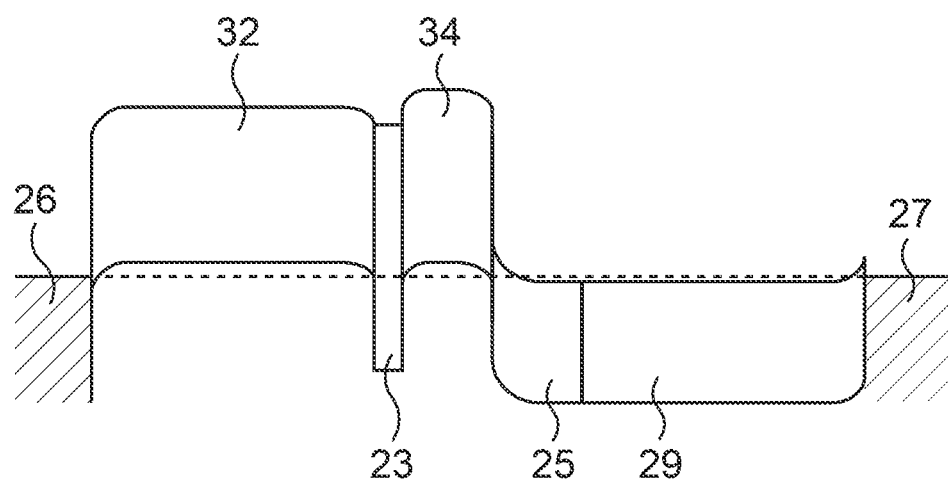
FIG. 6B is a view illustrating an energy band of the third embodiment in an equilibrium state.

Next, a third embodiment is described. FIGS. 6A and 6B are views illustrating a compound semiconductor device (backward diode) according to the third embodiment. FIG. 6A is a sectional view illustrating a structure of the compound semiconductor device, and FIG. 6B is a view illustrating an energy band in an equilibrium state.

In the third embodiment, as illustrated in FIG. 6A, a p-type semiconductor layer 32 is formed instead of the p-type semiconductor layer 22 in the second embodiment, and a p-type semiconductor layer 34 is formed instead of the p-type semiconductor layer 24 in the second embodiment. A mesa structure is formed at least at the n-type semiconductor layer 25 and the p-type semiconductor layer 34. The p-type semiconductor layer 32 is, for example, a p-type $GaAs_{0.45}Sb_{0.55}$ layer ($p^+$-GaAsSb layer). A thickness of the p-type semiconductor layer 32 is, for example, approximately 50 nm. For example, zinc (Zn) is doped into the p-type semiconductor layer 32 for approximately $5 \times 10^{18}$ $cm^{-3}$ as p-type impurity. The p-type semiconductor layer 34 is, for example, a p-type $GaAs_{0.51}Sb_{0.49}$ layer ($p^+$-GaAsSb layer). A thickness of the p-type semiconductor layer 34 is, for example, approximately 50 nm. For example, zinc (Zn) is doped into the n-type semiconductor layer 34 for approximately $5 \times 10^{18}$ $cm^{-3}$ as p-type impurity. Each of the p-type semiconductor layer 34 and the p-type semiconductor layer 32 is degenerated. An As fraction is lower and an Sb fraction is higher in the p-type semiconductor layer 32 than in the p-type semiconductor layer 34, and therefore, a band gap (forbidden band width) of the p-type semiconductor layer 32 is smaller than a bang gap (forbidden band width) of the p-type semiconductor layer 34. The p-type semiconductor layer 32 is an example of the first semiconductor layer, and the p-type semiconductor layer 34 is an example of the second semiconductor layer. The other configurations are similar to the second embodiment.

In the third embodiment, the n-type semiconductor layer 25 and the p-type semiconductor layer 34 are included in a backward diode. Namely, current does not flow in an equilibrium state, current does not flow until the forward bias reaches a certain threshold even if a forward bias is applied, and current flows owing to tunnel phenomenon when a backward bias is applied.

Besides, the band gap of the p-type semiconductor layer 32 is smaller than the band gap of the p-type semiconductor layer 34, and therefore, as illustrated in FIG. 6B, a part which is lower than the Fermi level is a little in the valence band in the p-type semiconductor layer 32 at an end of the ohmic electrode 26 side. Accordingly, the tunnel phenomenon is easy to happen, and a contact resistance of the ohmic electrode 26 with the p-type semiconductor layer 32 is low. It is because a material whose band gap is small has a smaller work function for a metal than a material whose band gap is large, and in the third embodiment, a Schottky barrier of the p-type semiconductor layer 32 is low. Further, the p-type semiconductor layer 32 takes a function to secure ohmic contact, and therefore, a thickness as same as a conventional art and the reference example is not required for the p-type semiconductor layer 34. Therefore, even if the mesa etching of the p-type semiconductor layer 34 is unstable, an effect thereof is extremely small.

Next, a method of manufacturing the compound semiconductor device (backward diode) according to the third embodiment is described. FIG. 7A to FIG. 7F are sectional views illustrating the method of manufacturing the compound semiconductor device according to the third embodiment in process sequence.

Figure 7A:
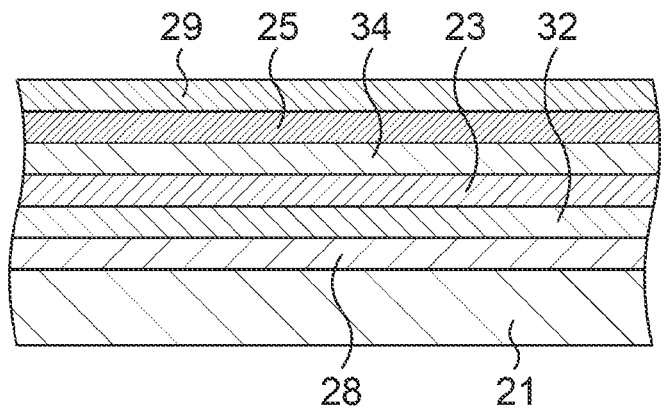
FIG. 7A to FIG. 7F are sectional views illustrating a method of manufacturing the compound semiconductor device according to the third embodiment in process sequence.

First, as illustrated in FIG. 7A, the buffer layer 28, the p-type semiconductor layer 32, the etching stopper layer 23, the p-type semiconductor layer 34, the n-type semiconductor layer 25, and the n-type semiconductor layer 29 are formed on the substrate 21. The buffer layer 28, the p-type semiconductor layer 32, the etching stopper layer 23, the p-type semiconductor layer 34, the n-type semiconductor layer 25, and the n-type semiconductor layer 29 may be formed by, for example, an MOCVD method.

Figure 7B:
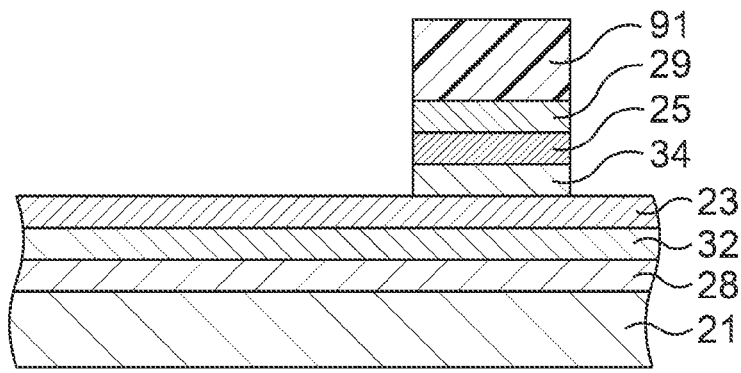

Then, as illustrated in FIG. 7B, the mask 91 is formed on the n-type semiconductor layer 29 similarly to the second embodiment. Thereafter, the n-type semiconductor layer 29, the n-type semiconductor layer 25, and the p-type semiconductor layer 34 are etched while using the mask 91 as an etching mask. In this etching, wet etching using, for example, a mixed solution of phosphoric acid and hydrogen peroxide solution may be performed. This etching stops at the etching stopper layer 23.

Figure 7C:
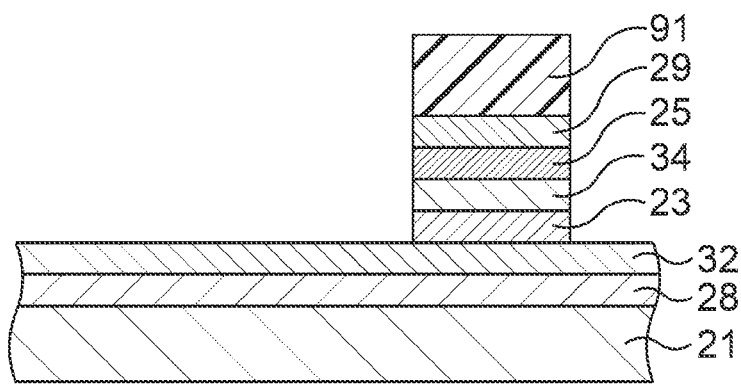

Thereafter, as illustrated in FIG. 7C, the etching stopper layer 23 is etched while using the mask 91 as an etching mask. In this etching, wet etching using, for example, hydrochloric acid may be performed. This etching stops at the p-type semiconductor layer 32.

Figure 7D:
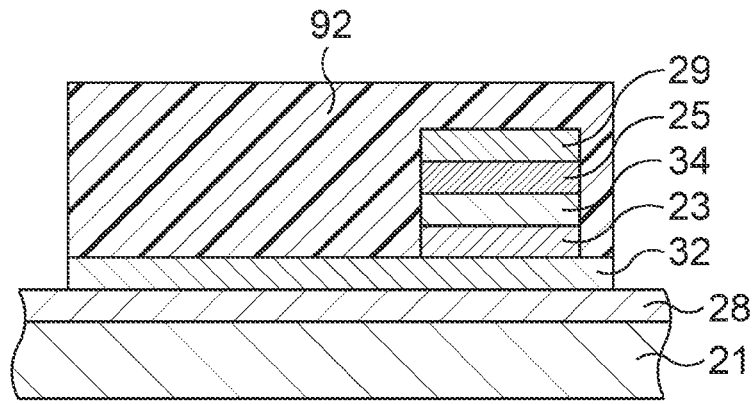

Subsequently, as illustrated in FIG. 7D, the mask 91 is removed and the mask 92 is formed on the p-type semiconductor layer 32 similarly to the second embodiment. Then, the p-type semiconductor layer 32 is etched while using the mask 92 as an etching mask. In this etching, wet etching using, for example, a mixed solution of phosphoric acid and hydrogen peroxide solution may be performed. This etching stops at the buffer layer 28.

Figure 7E:
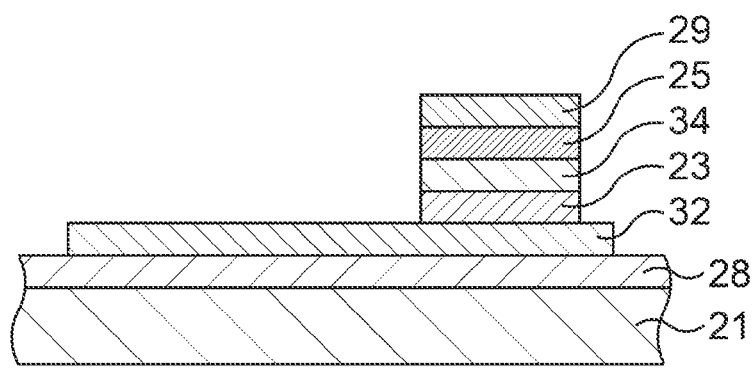
Figure 7F:
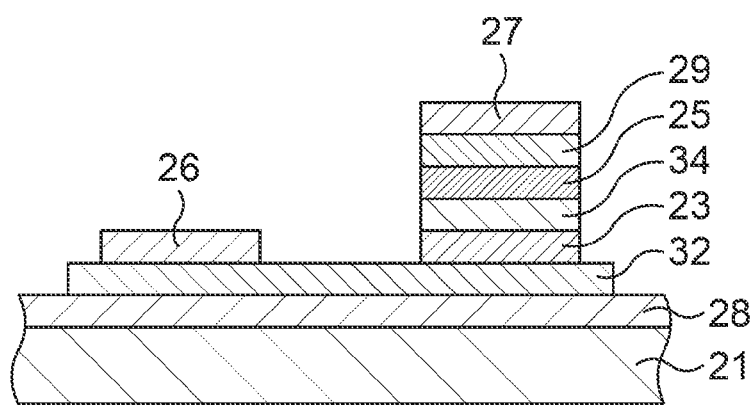

Thereafter, as illustrated in FIG. 7E, the mask 92 is removed. Subsequently, as illustrated in FIG. 7F, the ohmic electrode 26 is formed on a part of the p-type semiconductor layer 32, and the ohmic electrode 27 is formed on the n-type semiconductor layer 29. The ohmic electrodes 26 and 27 may be formed by, for example, a lift-off method.

A passivation film and so on are formed as necessary to complete the compound semiconductor device (backward diode).

In this manufacturing method, the p-type semiconductor layer 34 is thin, and therefore, a time required for etching the p-type semiconductor layer 34 is short, and even if the mesa etching of the p-type semiconductor layer 34 is unstable, an effect thereof is extremely small. Besides, even if the wet etching of the p-type semiconductor layer 32, which is relatively thick, is unstable, an effect on the characteristics of the backward diode is negligible. Further, the p-type semiconductor layer 34 is not etched during the wet etching of the p-type semiconductor layer 32. It is because the p-type semiconductor layer 34 is protected by the mask 92.

Fourth Embodiment

Figure 8A:
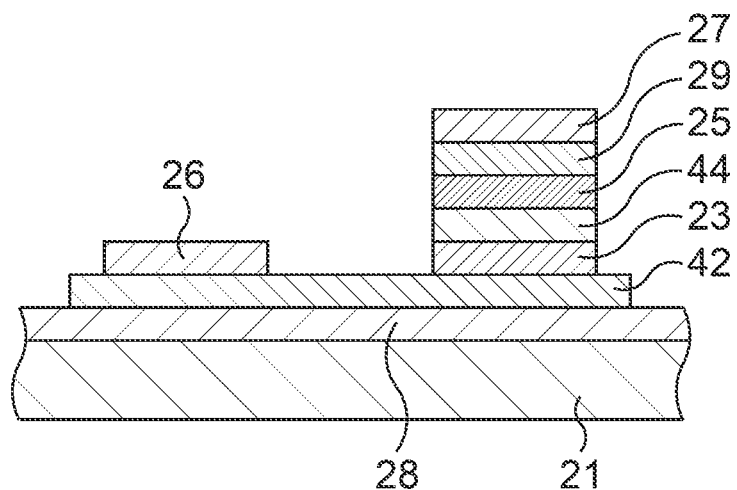
FIG. 8A is a sectional view illustrating a structure of a compound semiconductor device according to a fourth embodiment.
Figure 8B:
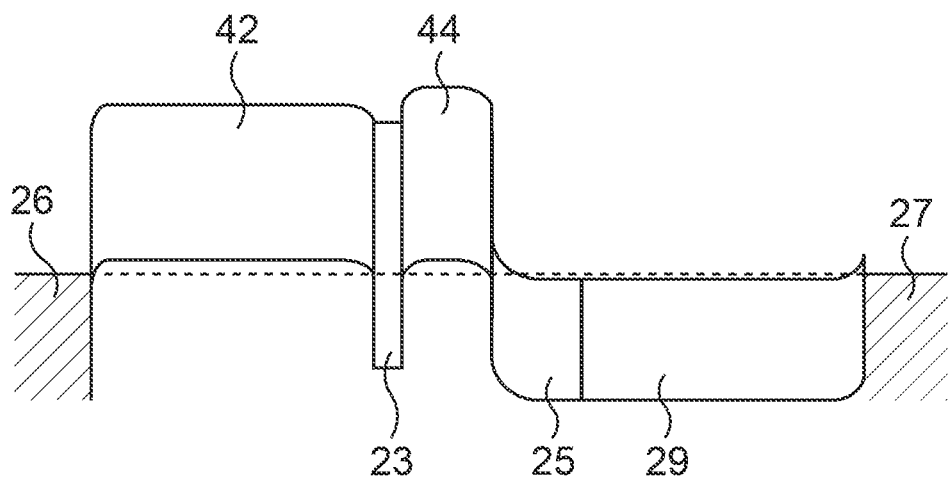
FIG. 8B is a view illustrating an energy band of the fourth embodiment in an equilibrium state.

Next, a fourth embodiment is described. FIGS. 8A and 8B are views illustrating a compound semiconductor device (backward diode) according to the fourth embodiment. FIG. 8A is a sectional view illustrating a structure of the compound semiconductor device, and FIG. 8B is a view illustrating an energy band in an equilibrium state.

In the fourth embodiment, as illustrated in FIG. 8A, a p-type semiconductor layer 42 is formed instead of the p-type semiconductor layer 22 in the second embodiment, and a p-type semiconductor layer 44 is formed instead of the p-type semiconductor layer 24 in the second embodiment. A mesa structure is formed at least at the n-type semiconductor layer 25 and the p-type semiconductor layer 44. The p-type semiconductor layer 42 is, for example, a p-type $GaAs_{0.45}Sb_{0.55}$ layer ($p^+$-GaAsSb layer). A thickness of the p-type semiconductor layer 42 is, for example, approximately 50 nm. For example, zinc (Zn) is doped into the p-type semiconductor layer 42 for approximately $2\times10^{19}$ cm$^{-3}$ as p-type impurity. The p-type semiconductor layer 44 is, for example, a p-type $GaAs_{0.51}Sb_{0.49}$ layer ($p^+$-GaAsSb layer). A thickness of the p-type semiconductor layer 44 is, for example, approximately 50 nm. For example, zinc (Zn) is doped into the n-type semiconductor layer 44 for approximately $5\times10^{18}$ cm$^{-3}$ as p-type impurity. Each of the p-type semiconductor layer 44 and the p-type semiconductor layer 42 is degenerated. An As fraction is lower and an Sb fraction is higher in the p-type semiconductor layer 42 than in the p-type semiconductor layer 44, and therefore, a band gap (forbidden band width) of the p-type semiconductor layer 42 is smaller than a band gap (forbidden band width) of the p-type semiconductor layer 44. The p-type semiconductor layer 42 is an example of the first semiconductor layer, and the p-type semiconductor layer 44 is an example of the second semiconductor layer. The other configurations are similar to the second embodiment.

In the fourth embodiment, the n-type semiconductor layer 25 and the p-type semiconductor layer 44 are included in a backward diode. Namely, current does not flow in an equilibrium state, current does not flow until the forward bias reaches a certain threshold even if a forward bias is applied, and current flows owing to tunnel phenomenon when a backward bias is applied.

Besides, impurities are doped into the p-type semiconductor layer 42 more than the p-type semiconductor layer 44, and the band gap of the p-type semiconductor layer 42 is smaller than the band gap of the p-type semiconductor layer 44. Therefore, change of the valence band of the p-type semiconductor layer 42 at an end of the ohmic electrode 26 side is abrupt as illustrated in FIG. 8B, and a part which is lower than the Fermi level is a little in the valence band in the p-type semiconductor layer 42 at the end of the ohmic electrode 26 side. Accordingly, effects of both the second embodiment and the third embodiment may be obtained. Namely, the tunnel phenomenon is further easy to happen, and a contact resistance of the ohmic electrode 26 with the p-type semiconductor layer 42 is further low. Moreover, the p-type semiconductor layer 42 takes a function to secure ohmic contact, and therefore, a thickness as same as a conventional art and the reference example is not required for the p-type semiconductor layer 44. Accordingly, even if the mesa etching of the p-type semiconductor layer 44 is unstable, an effect thereof is extremely small.

The compound semiconductor device (backward diode) according to the fourth embodiment may be manufactured by a method like to the method of manufacturing the second embodiment and the method of manufacturing the third embodiment.

Fifth Embodiment

Figure 9A:
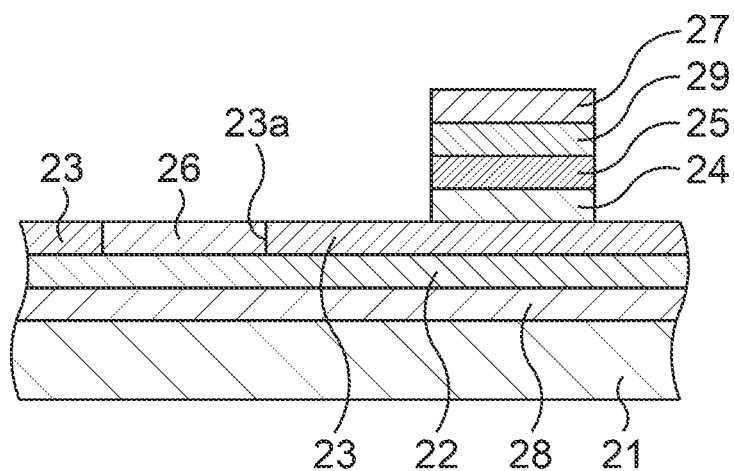
FIG. 9A is a sectional view illustrating a structure of a compound semiconductor device according to a fifth embodiment.
Figure 9B:
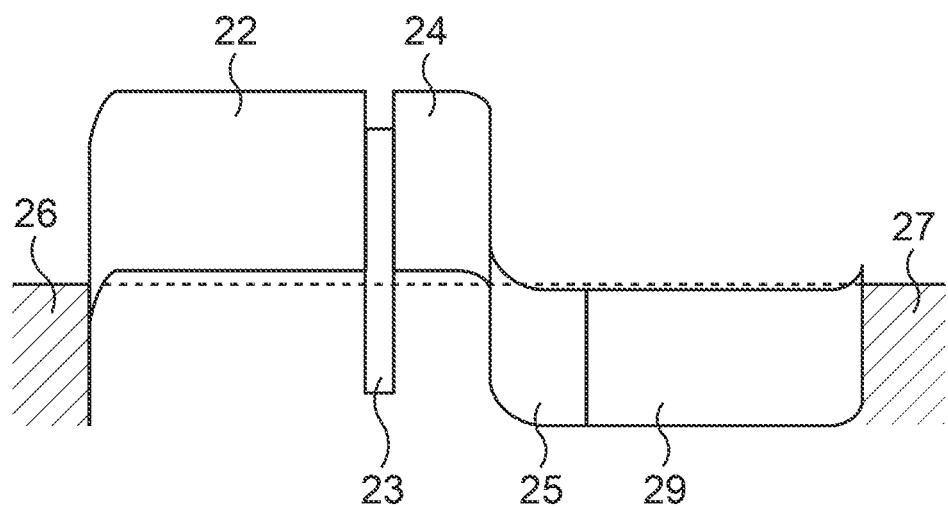
FIG. 9B is a view illustrating an energy band of the fifth embodiment in an equilibrium state.

Next, a fifth embodiment is described. FIGS. 9A and 9B are views illustrating a compound semiconductor device (backward diode) according to the fifth embodiment. FIG. 9A is a sectional view illustrating a structure of the compound semiconductor device, and FIG. 9B is a view illustrating an energy band in an equilibrium state.

In the fifth embodiment, as illustrated in FIG. 9A, the ohmic electrode 26 is formed on a part of the p-type semiconductor layer 22, and the etching stopper layer 23 is formed so as to cover the rest of the surface of the p-type semiconductor layer 22. The other configurations are similar to the second embodiment.

A similar effect as the second embodiment may also be obtained by the fifth embodiment. Further, in the fifth embodiment, the p-type semiconductor layer 22 is protected by the etching stopper layer 23.

Figure 10A:
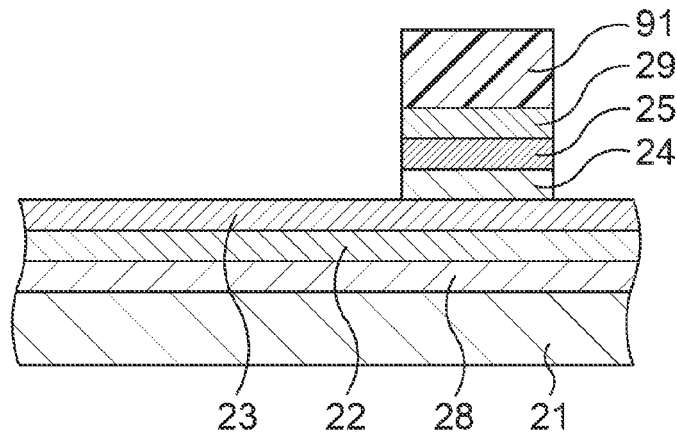
FIG. 10A to FIG. 10C are sectional views illustrating a method of manufacturing the compound semiconductor device according to the fifth embodiment in process sequence.
Figure 10B:
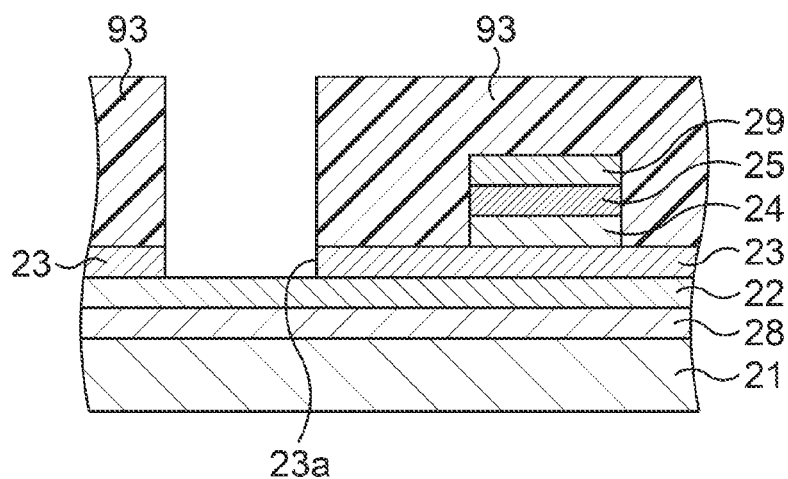
Figure 10C:
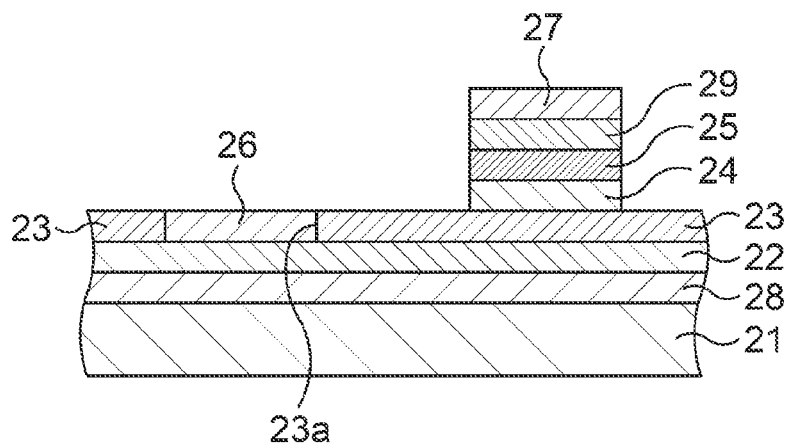

Next, a method of manufacturing the compound semiconductor device (backward diode) according to the fifth embodiment is described. FIG. 10A to FIG. 10C are sectional views illustrating the method of manufacturing the compound semiconductor device according to the fifth embodiment in process sequence.

First, as illustrated in FIG. 10A, the treatment to the etching of the n-type semiconductor layer 29, the n-type semiconductor layer 25, and the p-type semiconductor layer 24 while using the mask 91 as an etching mask are performed similarly to the second embodiment.

Then, as illustrated in FIG. 10B, the mask 91 is removed without performing the etching of the etching stopper layer 23 using the mask 91 as an etching mask. Thereafter, a mask 93 exposing a region where the ohmic electrode 26 is to be formed is formed on the etching stopper layer 23. The mask 93 is formed so as to cover the stack of the p-type semiconductor layer 24, the n-type semiconductor layer 25, and the n-type semiconductor layer 29. The mask 93 may be formed by, for example, a photolithography technology. Thereafter, the etching stopper layer 23 is etched while using the mask 93 as an etching mask, to form an opening 23a in the etching stopper layer 23 through which a part of the p-type semiconductor layer 22 is exposed.

Subsequently, as illustrated in FIG. 10C, the mask 93 is removed. Then, the ohmic electrode 26 is formed in the opening 23a, and the ohmic electrode 27 is formed on the n-type semiconductor layer 29. The ohmic electrodes 26 and 27 may be formed by, for example, a lift-off method similarly to the second embodiment.

A passivation film and so on are formed as necessary to complete the compound semiconductor device (backward diode).

Sixth Embodiment

Figure 11A:
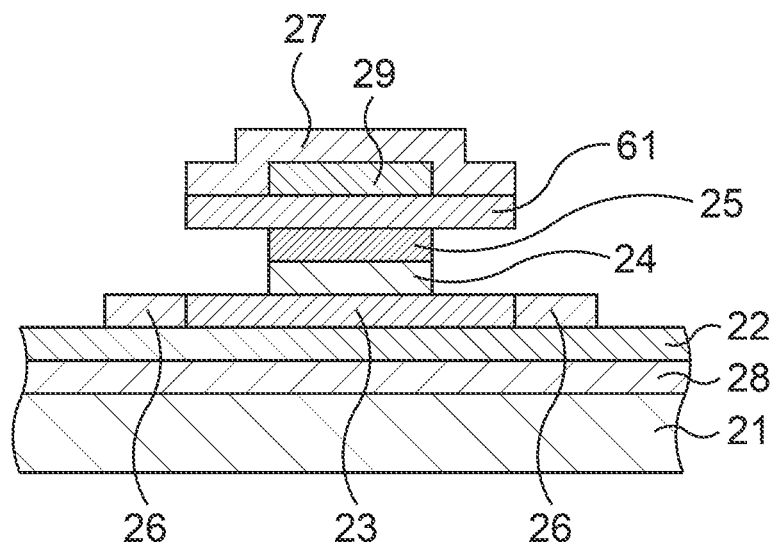
FIG. 11A is a sectional view illustrating a structure of a compound semiconductor device according to a sixth embodiment.
Figure 11B:
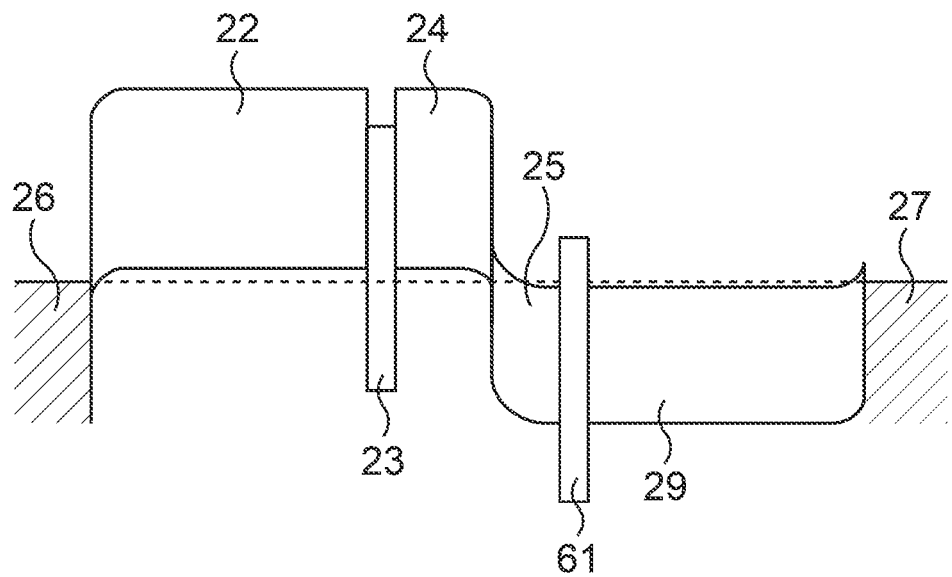
FIG. 11B is a view illustrating an energy band of the sixth embodiment in an equilibrium state.

Next, a sixth embodiment is described. FIGS. 11A and 11B are views illustrating a compound semiconductor device (backward diode) according to the sixth embodiment. FIG. 11A is a sectional view illustrating a structure of the compound semiconductor device, and FIG. 11B is a view illustrating an energy band in an equilibrium state.

In the sixth embodiment, as illustrated in FIG. 11A, contours of the p-type semiconductor layer 24, the n-type semiconductor layer 25, and the n-type semiconductor layer 29 are inside a contour of the etching stopper layer 23. Namely, the p-type semiconductor layer 24, the n-type semiconductor layer 25, and the n-type semiconductor layer 29 are inside the etching stopper layer 23 in planar view. An etching stopper layer 61 is between the n-type semiconductor layer 25 and the n-type semiconductor layer 29. The etching stopper layer 61 is, for example, an InP layer (i-InP layer), into which intentional impurity doping is not performed. A thickness of the etching stopper layer 61 is in a range in which electrons tunnel between the n-type semiconductor layer 25 and the n-type semiconductor layer 29, and for example, approximately 5 nm. A contour of the etching stopper layer 61 substantially matches with the contour of the etching stopper layer 23. Namely, the etching stopper layer 61 substantially overlaps with the etching stopper layer 23 in planar view.

The ohmic electrode 26 is formed on a part of the p-type semiconductor layer 22 so as to surround the etching stopper layer 23. The ohmic electrode 27 is formed on the etching stopper layer 61 so as to cover the n-type semiconductor layer 29. The other configurations are similar to the second embodiment.

A similar effect as the second embodiment may also be obtained by the sixth embodiment. Besides, it is possible to form the ohmic electrode 26 in a self-aligned manner relative to the ohmic electrode 27, though details will be described later. Accordingly, it is possible to form the ohmic electrode 26 at a position closer to the backward diode, and to further reduce a resistance between the ohmic electrode 26 and the backward diode.

Next, a method of manufacturing the compound semiconductor device (backward diode) according to the sixth embodiment is described. FIG. 12A to FIG. 12H are sectional views illustrating the method of manufacturing the compound semiconductor device according to the sixth embodiment in process sequence.

Figure 12A:
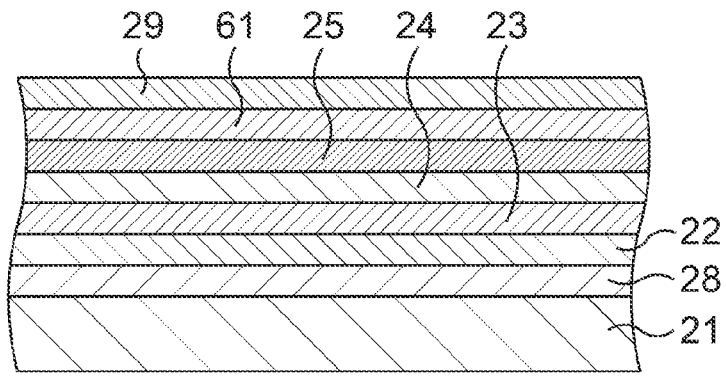
FIG. 12A to FIG. 12H are sectional views illustrating a method of manufacturing the compound semiconductor device according to the sixth embodiment in process sequence.

First, as illustrated in FIG. 12A, the buffer layer 28, the p-type semiconductor layer 22, the etching stopper layer 23, the p-type semiconductor layer 24, the n-type semiconductor layer 25, the etching stopper layer 61, and the n-type semiconductor layer 29 are formed on the substrate 21. These may be formed by, for example, an MOCVD method.

Figure 12B:
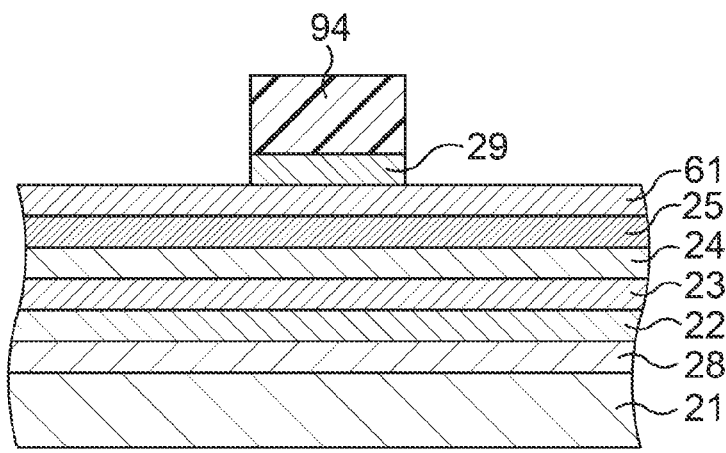

Then, as illustrated in FIG. 12B, a mask 94 covering a part of the n-type semiconductor layer 29 which is to be remained is formed on the n-type semiconductor layer 29. The mask 94 may be formed by, for example, a photolithography technology. Thereafter, the n-type semiconductor layer 29 is etched while using the mask 94 as an etching mask. In this etching, wet etching using, for example, a mixed solution of phosphoric acid and hydrogen peroxide solution may be performed. This etching stops at the etching stopper layer 61.

Figure 12C:
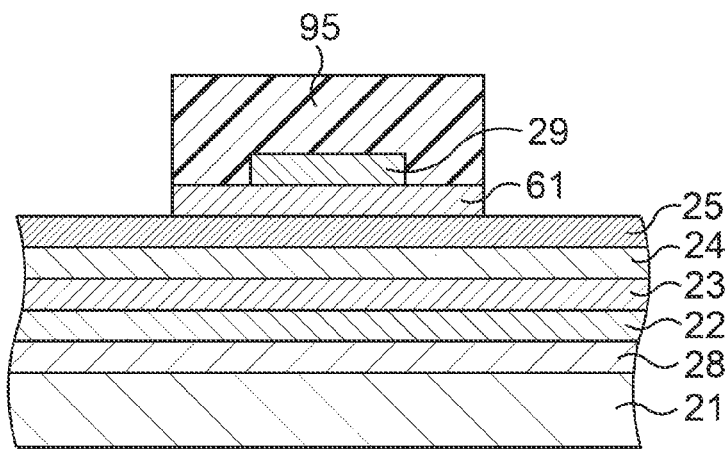

Subsequently, as illustrated in FIG. 12C, the mask 94 is removed, and a mask 95 covering a part of the etching stopper layer 61 which is to be remained is formed on the etching stopper layer 61. The mask 95 may be formed by, for example, a photolithography technology. Then, the etching stopper layer 61 is etched while using the mask 95 as an etching mask. In this etching, wet etching using, for example, hydrochloric acid may be performed. This etching stops at the n-type semiconductor layer 25.

Figure 12D:
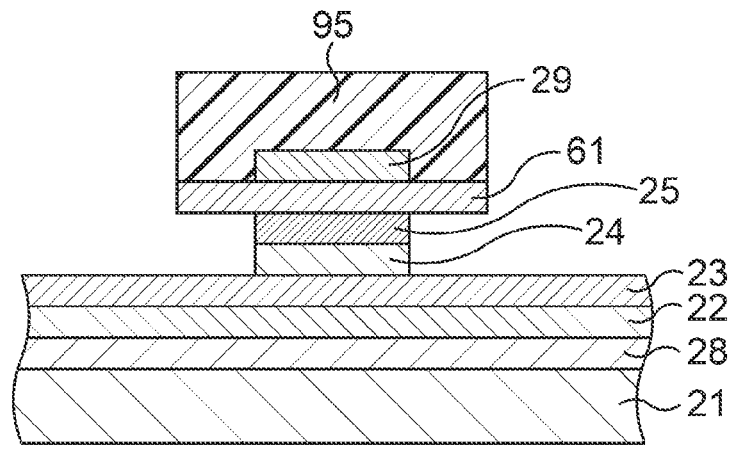

Thereafter, as illustrated in FIG. 12D, the n-type semiconductor layer 25 and the p-type semiconductor layer 24 are etched while using the mask 95 as an etching mask. In this etching, wet etching using, for example, a mixed solution of phosphoric acid and hydrogen peroxide solution may be performed. This etching stops at the etching stopper layer 23. Besides, in this etching, a lateral etching of the n-type semiconductor layer 25 and the p-type semiconductor layer 24 is performed. As a result, the contours of the n-type semiconductor layer 25 and the p-type semiconductor layer 24 are made to be inside the contour of the etching stopper layer 61. Namely, the p-type semiconductor layer 24 and the n-type semiconductor layer 25 are inside the etching stopper layer 61 in planar view.

Figure 12E:
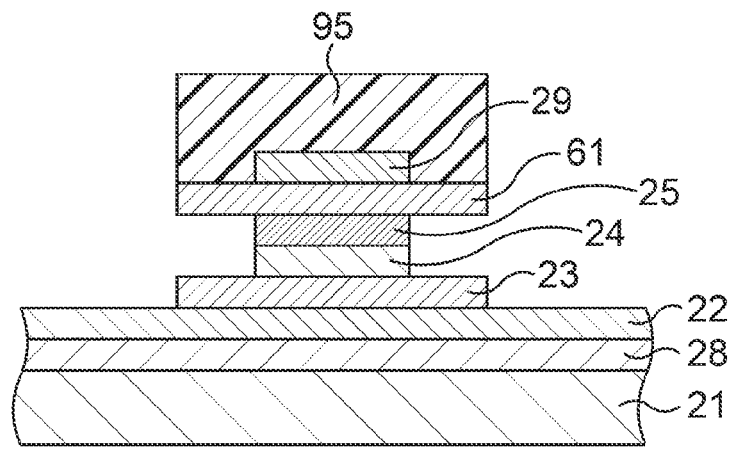

Subsequently, as illustrated in FIG. 12E, the etching stopper layer 23 is etched while using the mask 95 as an etching mask. In this etching, dry etching using, for example, argon (Ar) may be performed. This etching stops at the p-type semiconductor layer 22. The mask 95 used for the etching of the etching stopper layer 61 is also used for the dry etching of the etching stopper layer 23, and therefore, the contour of the etching stopper layer 23 substantially matches with the contour of the etching stopper layer 61. Namely, the etching stopper layer 23 substantially overlaps with the etching stopper layer 61 in planar view.

Figure 12F:
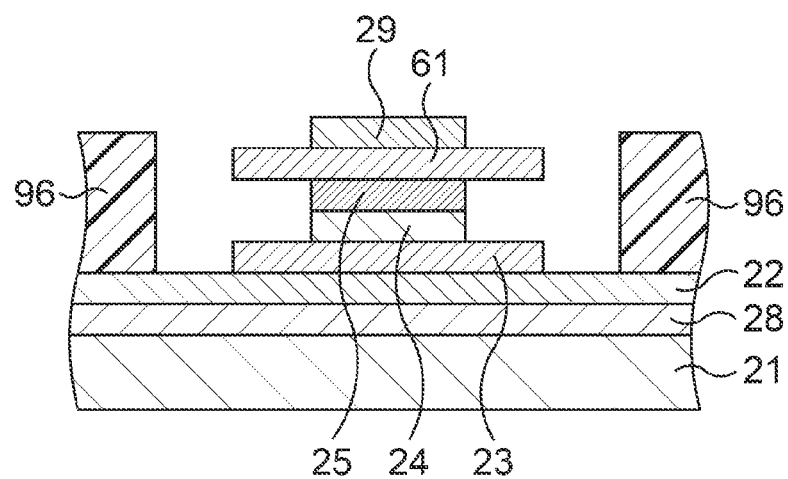

Then, as illustrated in FIG. 12F, the mask 95 is removed. Thereafter, a mask 96 exposing the region where the ohmic electrode 26 is to be formed and the region where the ohmic electrode 27 is to be formed and covering the other region is formed on the p-type semiconductor layer 22.

Figure 12G:
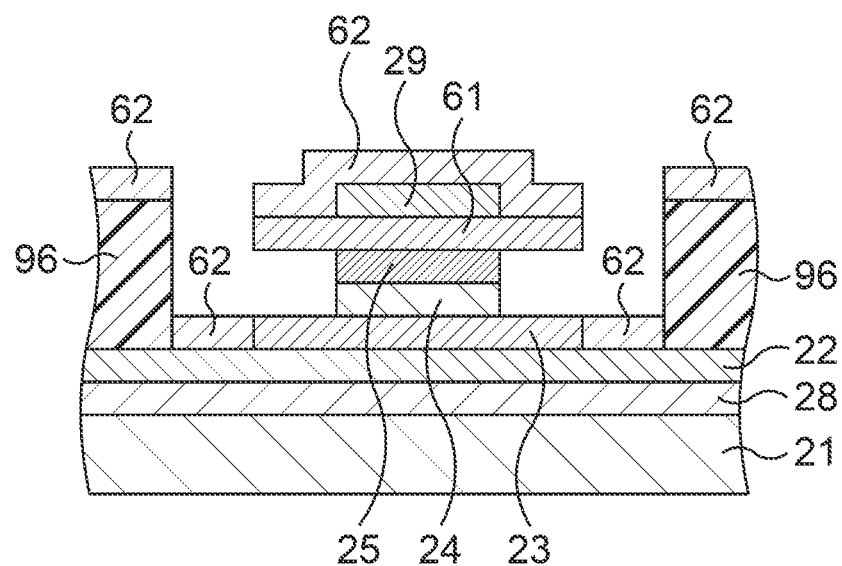

Thereafter, as illustrated in FIG. 12G, a conductive film 62 is formed on the mask 96, the p-type semiconductor layer 22, the etching stopper layer 61, and the n-type semiconductor layer 29. As the conductive film 62, for example, the Ti film, the Pt film, and the Au film are formed by a vapor deposition method. Thicknesses of the Ti film, the Pt film, and the Au film are, for example, approximately 10 nm, 30 nm, 50 nm respectively.

Figure 12H:
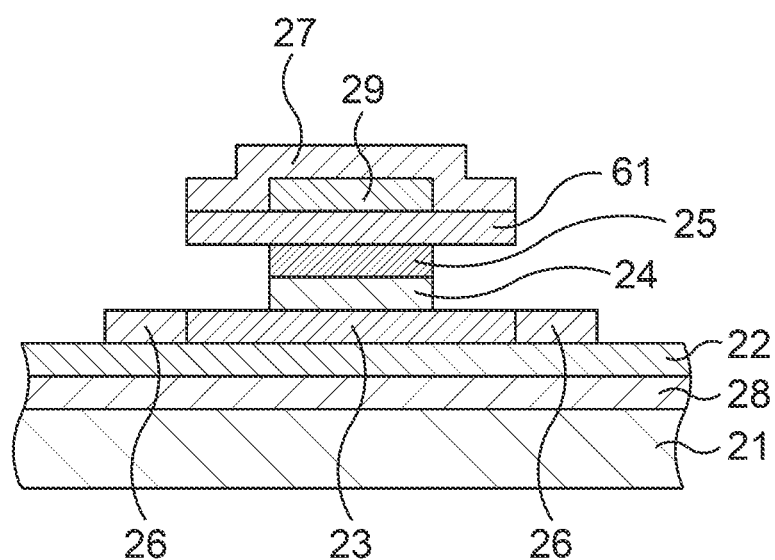

Subsequently, as illustrated in FIG. 12H, the mask 96 is removed together with the conductive film 62 thereon. A remaining part of the conductive film 62 on the p-type semiconductor layer 22 is the ohmic electrode 26, and a remaining part on the etching stopper layer 61 is the ohmic electrode 27.

A passivation film and so on are formed as necessary to complete the compound semiconductor device (backward diode).

In this manufacturing method, it is possible to form the ohmic electrode 26 in the self-aligned manner relative to the ohmic electrode 27. Accordingly, it is possible to set an interval between the backward diode and the ohmic electrode 26 in planar view to be less than 1 μm. On the other hand, when an opening for the ohmic electrode 27 is formed in addition to the opening for the ohmic electrode 26, it is preferable to provide an interval for at least approximately 1 μm to 2 μm between the ohmic electrode 26 and the backward diode in consideration for an effect of resolution and so on.

Seventh Embodiment

Figure 13A:
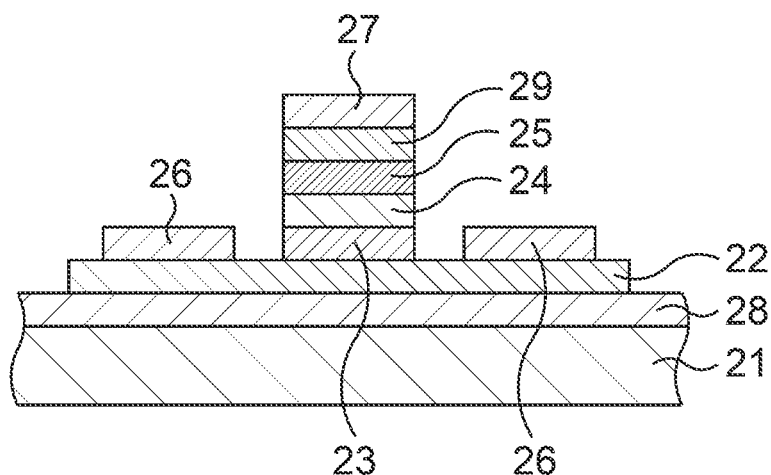
FIG. 13A is a sectional view illustrating a structure of a compound semiconductor device according to a seventh embodiment.
Figure 13B:
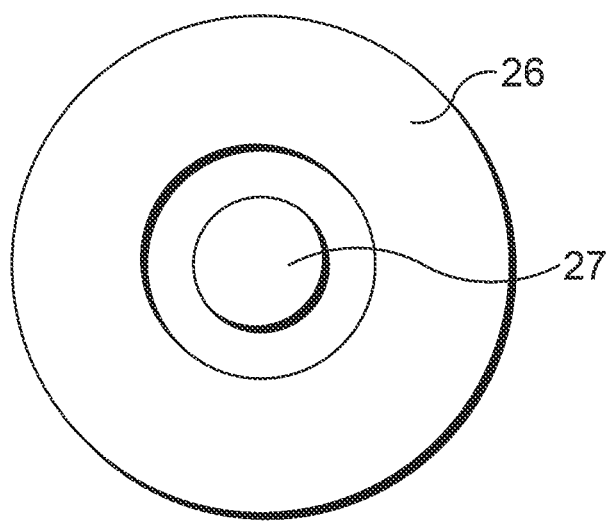
FIG. 13B is a layout view illustrating a positional relationship of electrodes in the seventh embodiment.

Next, a seventh embodiment is described. FIGS. 13A and 13B are views illustrating a compound semiconductor device (backward diode) according to the seventh embodiment. FIG. 13A is a sectional view illustrating a structure of the compound semiconductor device, and FIG. 13B is a layout view illustrating a positional relationship of electrodes.

In the seventh embodiment, as illustrated in FIG. 13, the ohmic electrode 26 is formed so as to surround the ohmic electrode 27 in planar view. The other configurations are similar to the second embodiment.

A similar effect as the second embodiment may also be obtained by the seventh embodiment. A layout similar to the seventh embodiment may be applied to the third to fifth embodiments.

Eighth Embodiment

Figure 14A:
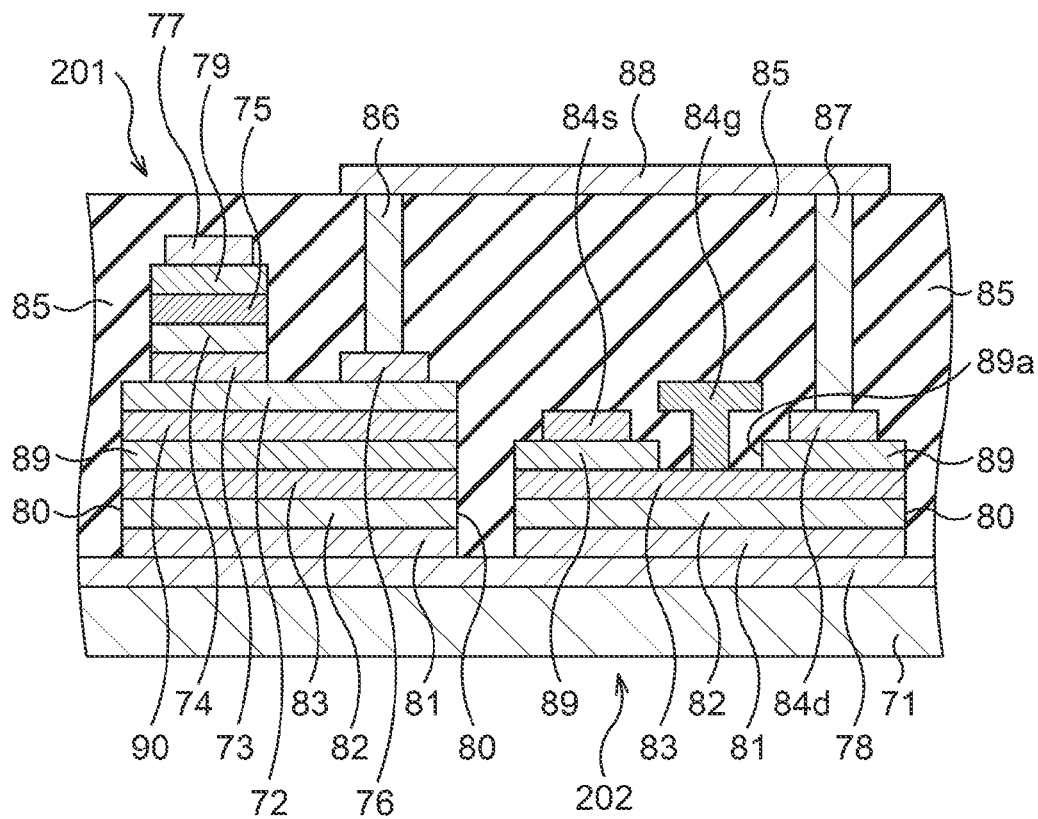
FIGS. 14A and 14B are views illustrating a compound semiconductor device according to an eighth embodiment.
Figure 14B:
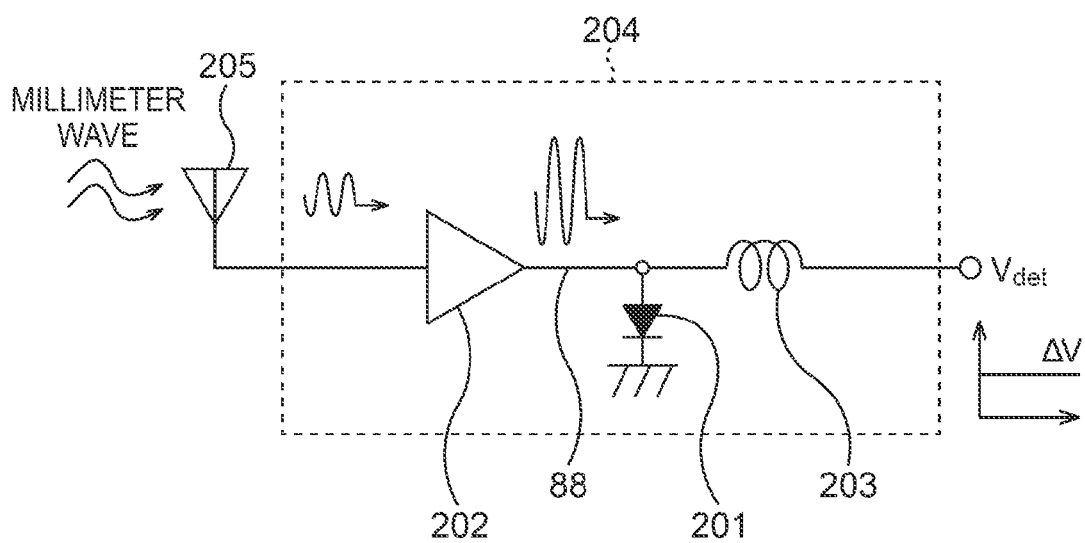

Next, an eighth embodiment is described. FIGS. 14A and 14B are views illustrating a compound semiconductor device according to the eighth embodiment.

As illustrated in FIGS. 14A and 14B, in the eighth embodiment, a wave detector 201, a low noise amplifier (LNA) 202, and an inductor 203 are integrated on a substrate 71. The wave detector 201, the LNA 202, and the inductor 203 are included in a monolithic microwave integrated circuit (MMIC) 204. The substrate 71 is, for example, a semi-insulating InP substrate. The LNA 202 is, for example, a high electron mobility transistor (HEMT).

A buffer layer 78 is formed on the substrate 71, a channel layer 81 is formed on the buffer layer 78, a carrier supply layer 82 is formed on the channel layer 81, and an etching stopper layer 83 is formed on the carrier supply layer 82. A cap layer 89 is formed on the etching stopper layer 83.

The substrate 71 is, for example, a semi-insulating InP substrate. The buffer layer 78 is, for example, an InAlAs layer (i-InAlAs layer), into which intentional impurity doping is not performed. The channel layer 81, is for example, an InGaAs layer (i-InGaAs layer), into which intentional impurity doping is not performed. The carrier supply layer 82 is, for example, an n-type InAlAs layer (n-InAlAs layer). The etching stopper layer 83 is, for example, an InP layer (i-InP layer), into which intentional impurity doping is not performed. The cap layer 89 is, for example, an n-type InGaAs layer (n-InGaAs layer). An element isolation mesa 80 is formed in the channel layer 81, the carrier supply layer 82, the etching stopper layer 83, and the cap layer 89, and the wave detector 201 and the LNA 202 are element-isolated from each other by the element isolation mesa 80.

In the LNA 202, a recess 89a is formed in the cap layer 89, and a gate electrode 84g is formed on the etching stopper layer 83 in the recess 89a. Besides, a source electrode 84s and a drain electrode 84d are formed on the cap layer 89 so as to sandwich the gate electrode 84g in planar view.

In the wave detector 201, an etching stopper layer 90 is formed on the cap layer 89, and a p-type semiconductor layer 72 is formed on the etching stopper layer 90. An etching stopper layer 73 is formed on a part of the p-type semiconductor layer 72, and a p-type semiconductor layer 74 is formed on the etching stopper layer 73. An n-type semiconductor layer 75 is formed on the p-type semiconductor layer 74, an n-type semiconductor layer 79 is formed on the n-type semiconductor layer 75, and an ohmic electrode 77 is formed on the n-type semiconductor layer 79. An ohmic electrode 76 is formed on another part of the p-type semiconductor layer 72.

The etching stopper layer 90 is, for example, an InP layer (i-InP layer), into which intentional impurity doping is not performed. The p-type semiconductor layer 72 is, for example, a p-type $GaAs_{0.51}Sb_{0.49}$ layer ($p^+$-GaAsSb layer). For example, zinc (Zn) is doped into the p-type semiconductor layer 72 for approximately $2 \times 10^{19}$ cm$^{-3}$ as p-type impurity. The etching stopper layer 73 is, for example, an InP layer (i-InP layer), into which intentional impurity doping is not performed. A thickness of the etching stopper layer 73 is in a range in which electrons tunnel between the p-type semiconductor layer 72 and the p-type semiconductor layer 74. The p-type semiconductor layer 74 is, for example, a p-type GaAs$_{0.51}$Sb$_{0.49}$ layer (p$^+$-GaAsSb layer). For example, zinc (Zn) is doped into the p-type semiconductor layer 74 for approximately 1×10$^{19}$ cm$^{-3}$ as p-type impurity. Each of the p-type semiconductor layer 74 and the p-type semiconductor layer 72 is degenerated.

The n-type semiconductor layer 75 is, for example, an n-type In$_{0.53}$Ga$_{0.47}$As layer (n$^+$-InGaAs layer). For example, silicon (Si) is doped into the n-type semiconductor layer 75 for approximately 1×10$^{18}$ cm$^{-3}$ as n-type impurity. The n-type semiconductor layer 79 is, for example, an n-type In$_{0.53}$Ga$_{0.47}$As layer (n$^+$-InGaAs layer). For example, silicon (Si) is doped into the n-type semiconductor layer 79 for approximately 2×10$^{19}$ cm$^{-3}$ as n-type impurity. Each of the n-type semiconductor layer 79 and the n-type semiconductor layer 75 is degenerated. The Ti film, the Pt film thereon, and the Au film thereon are included in each of the ohmic electrodes 76 and 77.

Further, an insulating film 85 covering the wave detector 201 and the LNA 202 is formed on the buffer layer 78 so as to be embedded in the element isolation mesa 80. Contact holes reaching the ohmic electrode 76, the ohmic electrode 77, the source electrode 84*s*, the drain electrode 84*d*, and the gate electrode 84*g* are formed in the insulating film 85. A conductive plug is formed in each contact hole. A wiring 88 connecting a conductive plug 86 connected to the ohmic electrode 76 and a conductive plug 87 connected to the drain electrode 84*d* to each other is formed on the insulating film 85.

In the eighth embodiment, for example, the ohmic electrode 77 of the wave detector 201 and the source electrode 84*s* of the LNA 202 are grounded, and one end of the inductor 203 is connected to the wiring 88. An antenna 205 receiving millimeter wave is connected to the gate electrode 84*g* of the LNA 202, and a detection signal V$_{det}$ is output from the other end of the inductor 203. As the detection signal V$_{det}$, a potential difference ΔV of several hundred mV is output.

In the wave detector 201, the n-type semiconductor layer 75 and the p-type semiconductor layer 74 are included in a backward diode. Accordingly, similar operations as the second embodiment are performed. Therefore, it is possible to output an appropriate detection signal V$_{det}$ even when a millimeter wave input from the antenna 205 is amplified by the LNA 202 into a signal having a large amplitude. The p-type semiconductor layer 72 is an example of the first semiconductor layer, the p-type semiconductor layer 74 is an example of the second semiconductor layer, the n-type semiconductor layer 75 is an example of the third semiconductor layer, and the etching stopper layer 73 is an example of the fourth semiconductor layer. The ohmic electrode 76 is an example of the first electrode, and the ohmic electrode 77 is an example of the second electrode.

Next, a method of manufacturing the compound semiconductor device according to the eighth embodiment is described. FIG. 15A to FIG. 15J are sectional views illustrating the method of manufacturing the compound semiconductor device according to the eighth embodiment in process sequence.

Figure 15A:
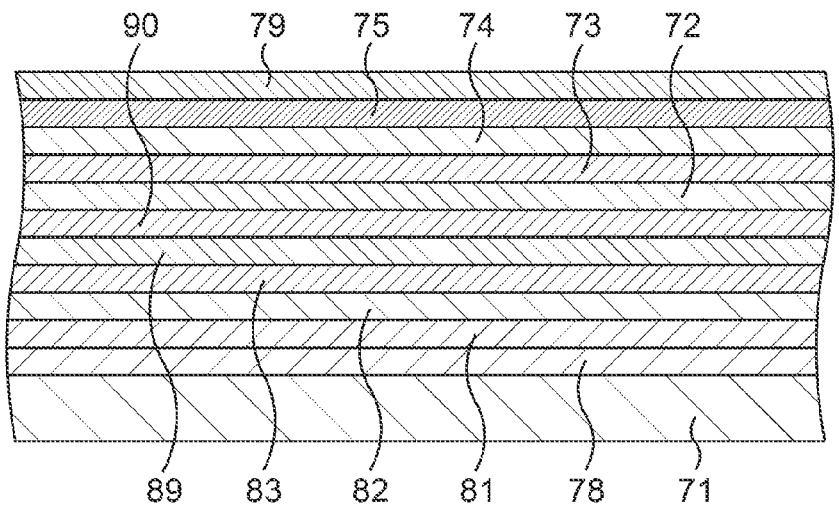
FIG. 15A to FIG. 15J are sectional views illustrating a method of manufacturing the compound semiconductor device according to the eighth embodiment in process sequence.

First, as illustrated in FIG. 15A, the buffer layer 78, the channel layer 81, the carrier supply layer 82, the etching stopper layer 83, the cap layer 89, the etching stopper layer 90, the p-type semiconductor layer 72, the etching stopper layer 73, the p-type semiconductor layer 74, the n-type semiconductor layer 75, and the n-type semiconductor layer 79 are formed on the substrate 71. These may be formed by, for example, an MOCVD method.

Figure 15B:
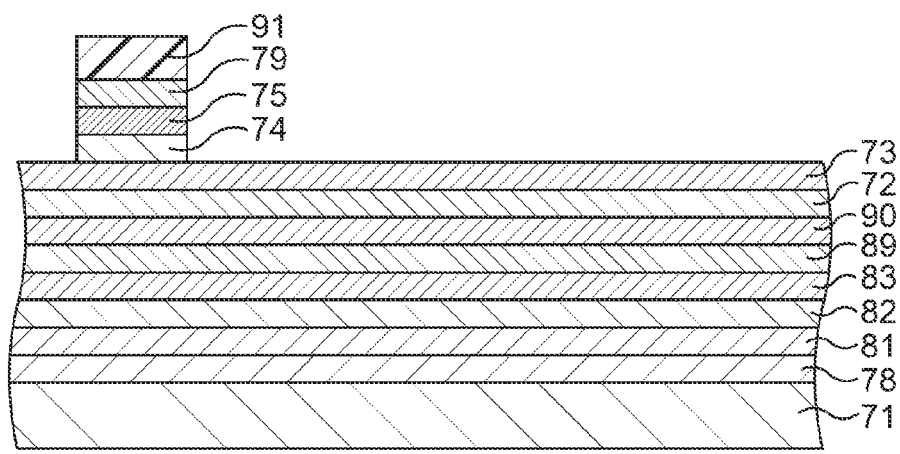

Then, as illustrated in FIG. 15B, the mask 91 covering a region where the backward diode is to be formed is formed on the n-type semiconductor layer 79. The mask 91 may be formed by, for example, a photolithography technology. Thereafter, the n-type semiconductor layer 79, the n-type semiconductor layer 75, and the p-type semiconductor layer 74 are etched while using the mask 91 as an etching mask. In this etching, wet etching using, for example, a mixed solution of phosphoric acid and hydrogen peroxide solution may be performed. This etching stops at the etching stopper layer 73.

Figure 15C:
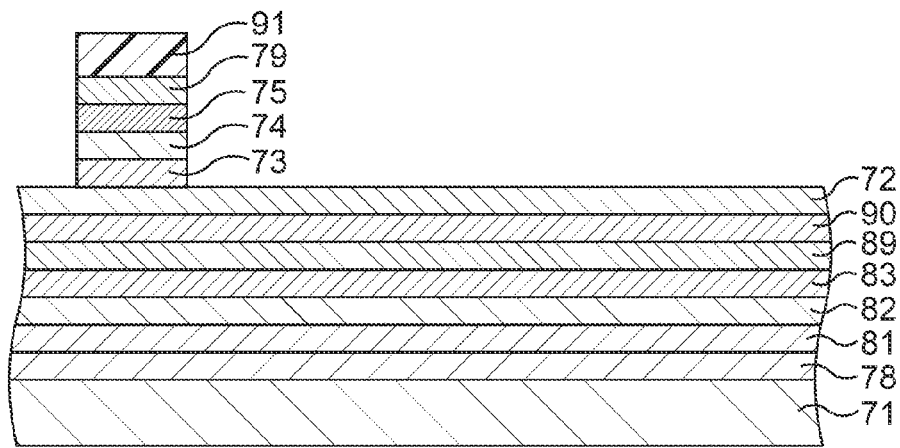

Subsequently, as illustrated in FIG. 15C, the etching stopper layer 73 is etched while using the mask 91 as an etching mask. In this etching, wet etching using, for example, hydrochloric acid may be performed. This etching stops at the p-type semiconductor layer 72.

Figure 15D:
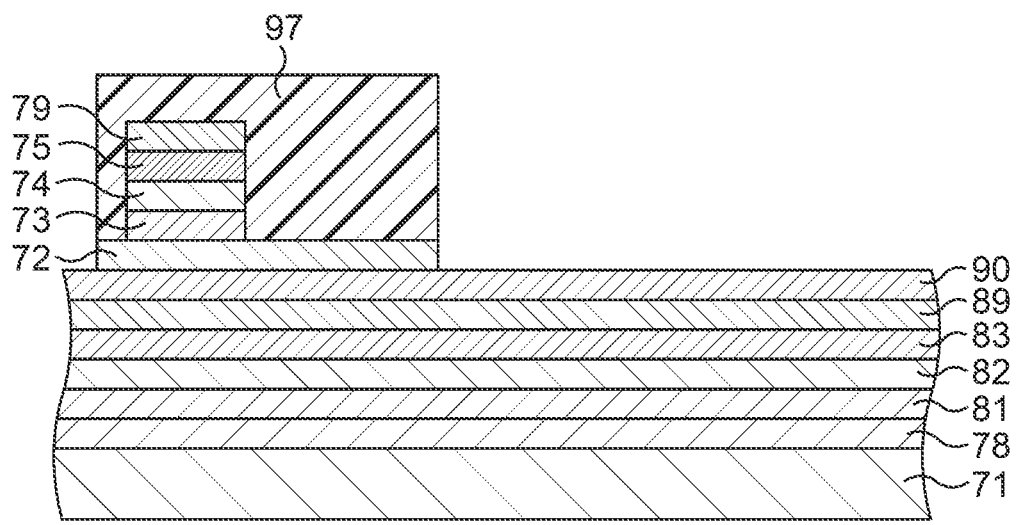

Then, as illustrated in FIG. 15D, the mask 91 is removed, and a mask 97 covering a region where the wave detector 201 is to be formed is formed on the p-type semiconductor layer 72. The mask 97 is formed so as to cover a stack of the etching stopper layer 73, the p-type semiconductor layer 74, the n-type semiconductor layer 75, and the n-type semiconductor layer 79. Thereafter, the p-type semiconductor layer 72 is etched while using the mask 97 as an etching mask. In the etching of the p-type semiconductor layer 72, wet etching using, for example, a mixed solution of phosphoric acid and hydrogen peroxide solution may be performed. This etching stops at the etching stopper layer 90.

Figure 15E:
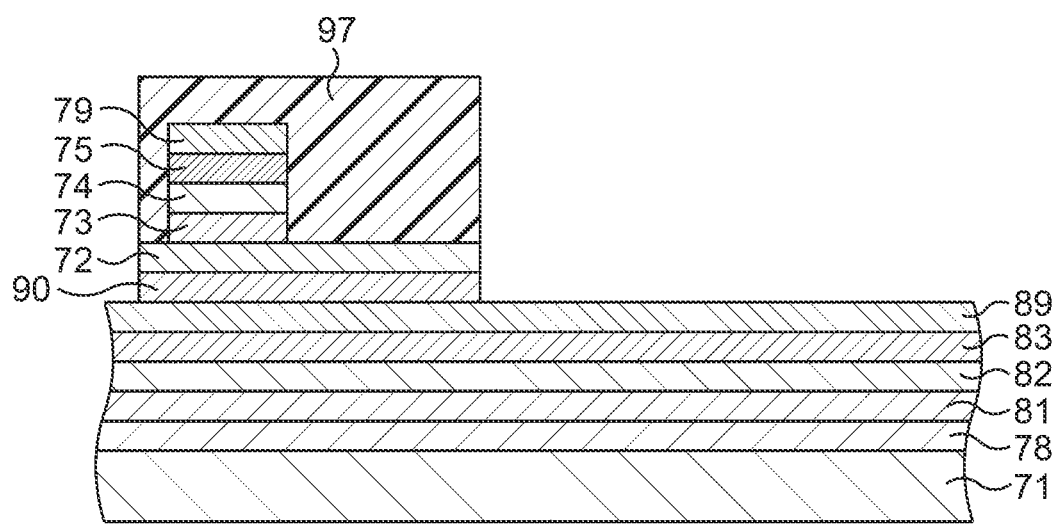

Subsequently, as illustrated in FIG. 15E, the etching stopper layer 90 is etched while using the mask 97 as an etching mask. In the etching of the etching stopper layer 90, wet etching using, for example, hydrochloric acid may be performed. This etching stops at the cap layer 89.

Figure 15F:
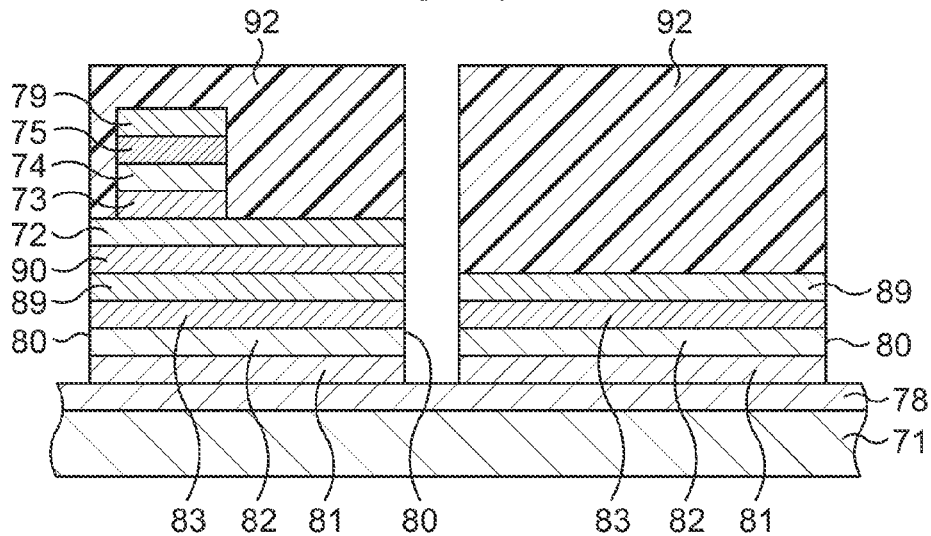

Then, as illustrated in FIG. 15F, the mask 97 is removed, and the mask 92 exposing a region where the element isolation mesa 80 is to be formed is formed on the cap layer 89 and the p-type semiconductor layer 72. The mask 92 is formed so as to cover the stack of the etching stopper layer 73, the p-type semiconductor layer 74, the n-type semiconductor layer 75, and the n-type semiconductor layer 79. Thereafter, the cap layer 89, the etching stopper layer 83, the carrier supply layer 82, and the channel layer 81 are etched while using the mask 92 as an etching mask. In the etching of the cap layer 89, wet etching using, for example, a mixed solution of phosphoric acid and hydrogen peroxide solution may be performed. In the etching of the etching stopper layer 83, wet etching using, for example, hydrochloric acid may be performed. In the etching of the carrier supply layer 82 and the channel layer 81, wet etching using, for example, a mixed solution of phosphoric acid and hydrogen peroxide solution may be performed. This etching stops at the buffer layer 78.

Figure 15G:
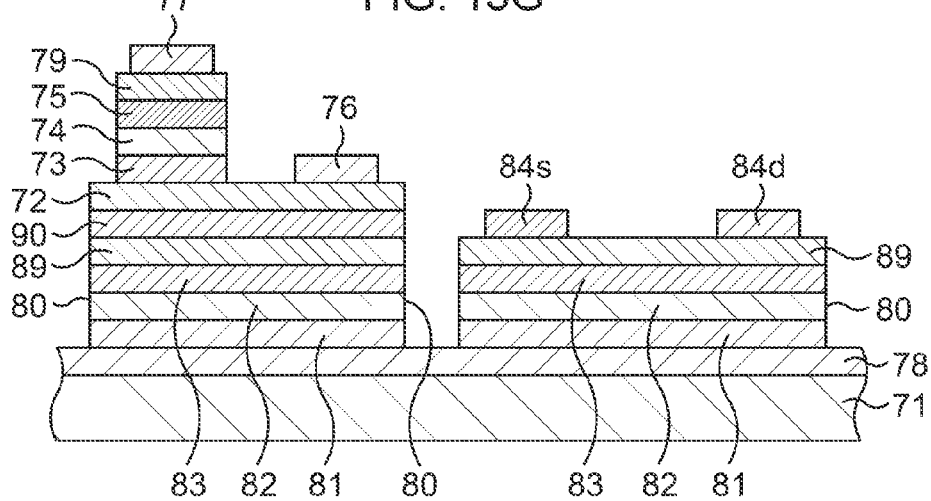

Subsequently, as illustrated in FIG. 15G, the ohmic electrode 76 is formed on a part of the p-type semiconductor layer 72 and the ohmic electrode 77 is formed on the n-type semiconductor layer 79 as for the wave detector 201. The source electrode 84*s* is formed on a part of the cap layer 89 and the drain electrode 84*d* is formed on another part of the cap layer 89 as for the LNA 202. The ohmic electrode 76, the ohmic electrode 77, the source electrode 84*s*, and the drain electrode 84*d* may be formed by, for example, a lift-off method. They may be formed collectively or separately.

Figure 15H:
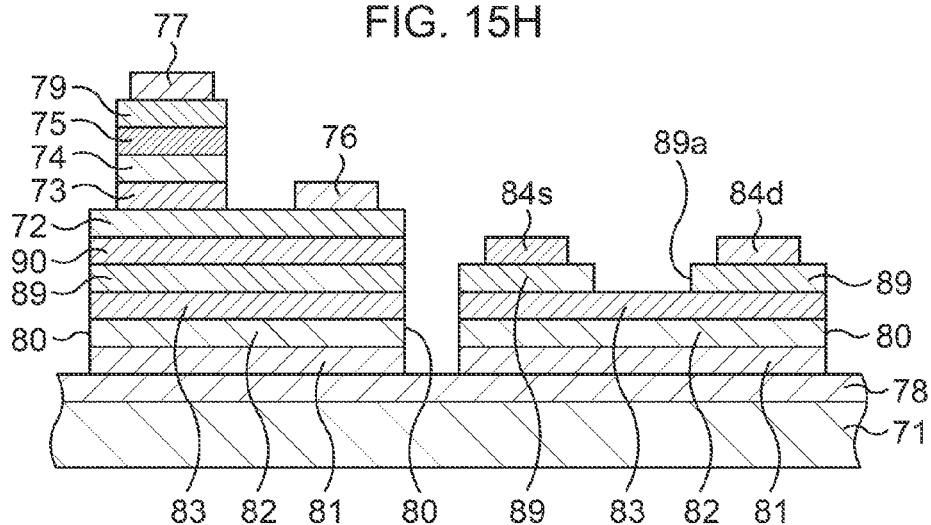

Then, as illustrated in FIG. 15H, the recess 89*a* is formed in the cap layer 89 exposed between the source electrode 84*s* and the drain electrode 84*d*. In the forming of the recess 89*a*, a mask exposing a region where the recess 89*a* is to be formed is formed by a photolithography technology, and wet etching of the cap layer 89 is performed while using this mask as an etching mask. In this etching, wet etching using, for example, a mixed solution of phosphoric acid and hydrogen peroxide solution may be performed. This etching stops at the etching stopper layer 83. The mask is removed after the wet etching.

Figure 15I:
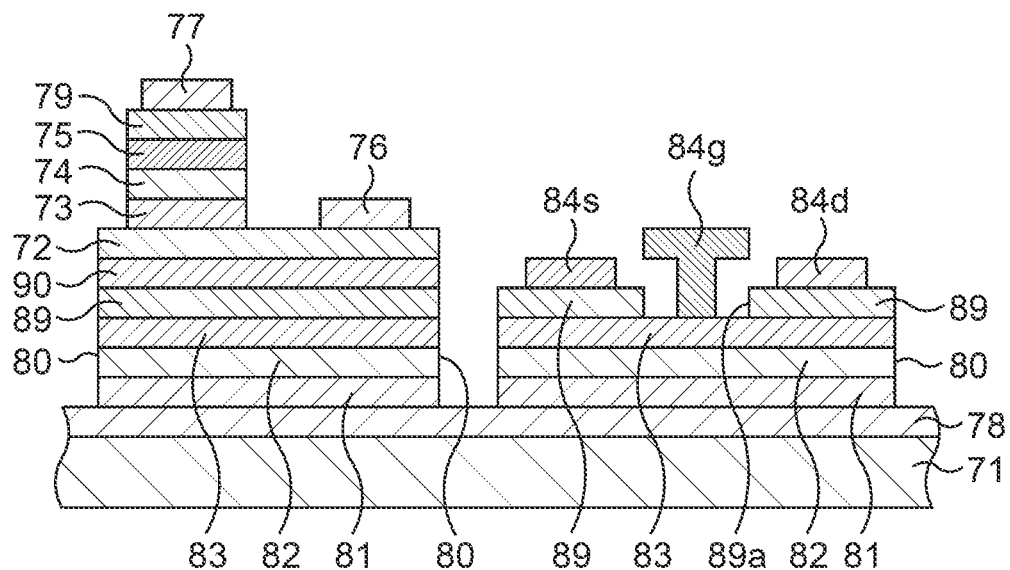

Thereafter, as illustrated in FIG. 15I, the gate electrode 84g is formed on the etching stopper layer 83 in the recess 89a. The gate electrode 84g may be formed by, for example, a lift-off method.

Figure 15J:
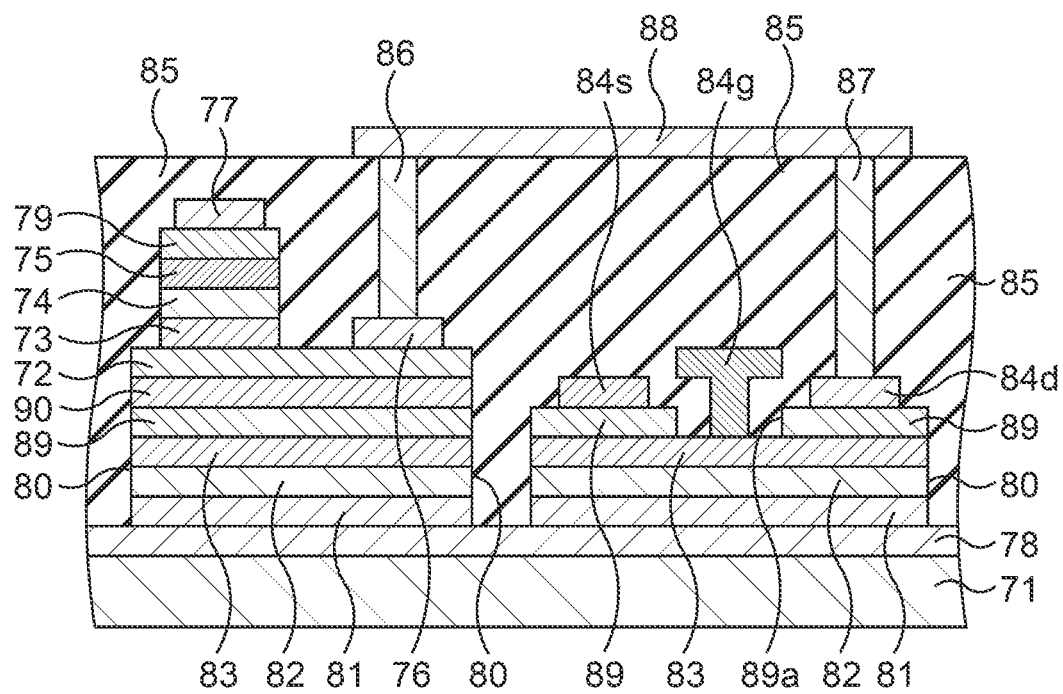

Subsequently, as illustrated in FIG. 15J, the insulating film 85 covering the wave detector 201 and the LNA 202 is formed. As a material of the insulating film 85, for example, benzocyclobutene (BCB), polyimide, or the like is used. Then, the contact holes reaching the ohmic electrode 76, the ohmic electrode 77, the source electrode 84s, the drain electrode 84d, and the gate electrode 84g are formed in the insulating film 85, and the conductive plug is formed in each contact hole. Thereafter, the wiring 88 connecting the conductive plug 86 connected to the ohmic electrode 76 and the conductive plug 87 connected to the drain electrode 84d to each other is formed on the insulating film 85.

The inductor 203 may be formed in the time period in which the wiring 88 is formed. The inductor 203 may be formed before the insulating film 85 is formed.

The other wirings and so on are formed as necessary to complete the compound semiconductor device.

The eighth embodiment is an application example of the second embodiment, but the first, and the third to seventh embodiments may be applied to a similar MMIC.

A barrier layer may be between the p-type semiconductor layer and the n-type semiconductor layer constituting a backward diode. The barrier layer may be, for example, an InP layer (i-InP layer), into which intentional impurity doping is not performed. An impurity concentration of each of the p-type semiconductor layer and the n-type semiconductor layer constituting a diode may be made low so that they are not degenerated. In this case, the diode functions as not a backward diode but a pn junction diode.

According to the above-stated compound semiconductor device and so on, a p-type second semiconductor layer is nearer a substrate than an n-type third semiconductor layer, and a fourth semiconductor layer is beneath the p-type second semiconductor layer, and therefore, it is possible to form a mesa structure more stably.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
   a substrate;
   a p-type first semiconductor layer over the substrate and contains antimony;
   a p-type second semiconductor layer over the first semiconductor layer and contains antimony;
   an n-type third semiconductor layer over the second semiconductor layer;
   a fourth semiconductor layer between the first semiconductor layer and the second semiconductor layer, the fourth semiconductor layer containing phosphorus and having a thickness in which electrons tunnel between the first semiconductor layer and the second semiconductor layer;
   a first electrode in ohmic contact with the first semiconductor layer; and
   a second electrode in ohmic contact with the third semiconductor layer,
   wherein the first semiconductor layer is made from a material whose contact resistance with the first electrode is lower than contact resistance of the second semiconductor layer.

2. The compound semiconductor device according to claim 1, wherein a mesa structure is formed at least at the third semiconductor layer and the second semiconductor layer.

3. The compound semiconductor device according to claim 1, wherein an impurity concentration of the first semiconductor layer is higher than an impurity concentration of the second semiconductor layer.

4. The compound semiconductor device according to claim 1, wherein a band gap of the first semiconductor layer is smaller than a band gap of the second semiconductor layer.

5. The compound semiconductor device according to claim 1, wherein the first semiconductor layer and the second semiconductor layer are degenerated.

6. The compound semiconductor device according to claim 1, wherein the third semiconductor layer is degenerated.

7. The compound semiconductor device according to claim 1, further comprising a high electron mobility transistor over the substrate.

8. The compound semiconductor device according to claim 1, wherein each of the first semiconductor layer and the second semiconductor layer is a GaAsSb layer.

9. The compound semiconductor device according to claim 1, wherein the fourth semiconductor layer is an InP layer.

10. A method of manufacturing a compound semiconductor device, comprising:
    forming a p-type first semiconductor layer containing antimony over a substrate;
    forming a fourth semiconductor layer containing phosphorus over the first semiconductor layer;
    forming a p-type second semiconductor layer containing antimony over the fourth semiconductor layer;
    forming an n-type third semiconductor layer over the second semiconductor layer;
    etching the third semiconductor layer and the second semiconductor layer until the fourth semiconductor layer is exposed;
    etching the fourth semiconductor layer until the first semiconductor layer is exposed;
    forming a first electrode in ohmic contact with the first semiconductor layer; and
    forming a second electrode in ohmic contact with the third semiconductor layer,
    wherein the first semiconductor layer is made from a material whose contact resistance with the first electrode is lower than that of the second semiconductor layer, and
    the fourth semiconductor layer has a thickness in which electrons tunnel between the first semiconductor layer and the second semiconductor layer.

11. The method according to claim 10, wherein an impurity concentration of the first semiconductor layer is higher than an impurity concentration of the second semiconductor layer.

12. The method according to claim 10, wherein a band gap of the first semiconductor layer is smaller than a band gap of the second semiconductor layer.

13. The method according to claim 10, wherein the first semiconductor layer and the second semiconductor layer are degenerated.

14. The method according to claim 10, wherein the third semiconductor layer is degenerated.

15. The method according to claim 10, further comprising forming a high electron mobility transistor over the substrate.

16. The method according to claim 10, wherein each of the first semiconductor layer and the second semiconductor layer is a GaAsSb layer.

17. The method according to claim 10, wherein the fourth semiconductor layer is an InP layer.

\* \* \* \* \*